United States Patent
Lee et al.

(10) Patent No.: US 7,270,886 B2
(45) Date of Patent: *Sep. 18, 2007

(54) SPIN-ON GLASS COMPOSITION AND METHOD OF FORMING SILICON OXIDE LAYER IN SEMICONDUCTOR MANUFACTURING PROCESS USING THE SAME

(75) Inventors: Jung-Ho Lee, Gyeonggi-do (KR); Jun-Hyun Cho, Suwon-si (KR); Jung-Sik Choi, Seoul (KR); Dong-Jun Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 197 days.

This patent is subject to a terminal disclaimer.

(21) Appl. No.: 10/861,517

(22) Filed: Jun. 7, 2004

(65) Prior Publication Data
US 2004/0224537 A1 Nov. 11, 2004

Related U.S. Application Data

(63) Continuation-in-part of application No. 10/278,992, filed on Oct. 24, 2002, now Pat. No. 7,179,537, which is a continuation-in-part of application No. 09/686,624, filed on Oct. 12, 2000, now Pat. No. 6,706,646.

(30) Foreign Application Priority Data
Nov. 11, 2003 (KR) ............... 10-2003-0079508

(51) Int. Cl.
B32B 7/02 (2006.01)
H01L 21/316 (2006.01)
C08L 83/00 (2006.01)

(52) U.S. Cl. ............... 428/447; 438/760; 438/782; 438/790; 524/580

(58) Field of Classification Search ............... None
See application file for complete search history.

(56) References Cited

U.S. PATENT DOCUMENTS 5,310,720 A 5/1994 Shin et al.

(Continued)

FOREIGN PATENT DOCUMENTS

JP 08-269399 * 10/1996

(Continued)

OTHER PUBLICATIONS

Machine translation of JP 08-269399, provided by the JPO website.*

(Continued)

Primary Examiner—Michael J. Feely
(74) Attorney, Agent, or Firm—Harness, Dickey & Pierce, P.L.C.

(57) ABSTRACT

A spin-on glass (SOG) composition and a method of forming a silicon oxide layer utilizing the SOG composition are disclosed. The method includes coating on a semiconductor substrate having a surface discontinuity, an SOG composition containing polysilazane having a compound of the formula —$(SiH_2NH)_n$— wherein n represents a positive integer, a weight average molecular weight within the range of about 3,300 to 3,700 to form a planar SOG layer. The SOG layer is converted to a silicon oxide layer with a planar surface by curing the SOG layer. Also disclosed is a semiconductor device made by the method.

14 Claims, 34 Drawing Sheets

U.S. PATENT DOCUMENTS

| | | |
|---|---|---|
| 5,976,618 A | 11/1999 | Fukuyama et al. |
| 6,479,405 B2 | 11/2002 | Lee et al. |
| 6,566,229 B2 * | 5/2003 | Hong et al. ............... 438/435 |
| 6,706,646 B1 * | 3/2004 | Lee et al. ............... 438/782 |
| 6,762,126 B2 * | 7/2004 | Cho et al. ............... 438/694 |
| 7,015,144 B2 * | 3/2006 | Hong et al. ............... 438/694 |
| 7,053,005 B2 * | 5/2006 | Lee et al. ............... 438/758 |
| 2002/0055271 A1 | 5/2002 | Lee et al. |
| 2002/0160614 A1 * | 10/2002 | Cho et al. ............... 438/694 |
| 2003/0040194 A1 * | 2/2003 | Lee et al. ............... 438/760 |
| 2006/0094243 A1 * | 5/2006 | Hong et al. ............... 438/694 |

FOREIGN PATENT DOCUMENTS

| | | |
|---|---|---|
| JP | 11-145286 | 5/1999 |
| KR | 20020068672 | 8/2003 |

OTHER PUBLICATIONS

Office Action dated Nov. 7, 2005 for counterpart Korean application.

* cited by examiner

| TABLE 1 | EXAMPLE 4 | EXAMPLE 5 | EXAMPLE 6 | EXAMPLE 7 | COMPARATIVE EXAMPLE |
|---|---|---|---|---|---|
| MOLECULAR WEIGHT DISTRIBUTION | 2.8 | 2.92 | 3.17 | 3.38 | 3.92 |
| VISCOSITY (mPas) | 1.54 | 1.55 | 1.59 | 1.66 | 1.78 |
| SOLID CONTENTS (WEIGHT%) | 22.6 | 22.6 | 21.6 | 21.8 | 21.1 |

| TABLE 2 | EXAMPLE 4 | EXAMPLE 5 | EXAMPLE 6 | EXAMPLE 7 | COMPARATIVE EXAMPLE 1 |
|---|---|---|---|---|---|
| 0.5μm LIQUID PARTICLES (COUNT/cc) | 0 | 0.1 | 0 | 0.1 | 0 |
| 0.3μm-0.5μm LIQUID PARTICLES (COUNT/cc) | 0.7 | 2 | 0.2 | 0.3 | 0.1 |

| TABLE 3 | EXAMPLE 8 | EXAMPLE 9 | EXAMPLE 10 | EXAMPLE 11 | COMPARATIVE EXAMPLE 2 |
|---|---|---|---|---|---|
| AFTER PRE-BAKING SOG THICKNESS (Å) | 7896 | 7781 | 7509 | 7784 | 7715 |
| AFTER MAIN-BAKING SOG THICKNESS (Å) | 6150 | 6010 | 5888 | 6042 | 5986 |
| SHRINKAGE RATIO (%) | 22.1 | 22.8 | 21.6 | 22.4 | 22.4 |

| TABLE 4 | EXAMPLE 8 | EXAMPLE 9 | EXAMPLE 10 | EXAMPLE 11 | COMPARATIVE EXAMPLE 2 |
|---|---|---|---|---|---|
| AFTER PRE-BAKING WIWNU (%) | 1.0 | 1.99 | 0.8 | 0.81 | 0.82 |
| AFTER MAIN-BAKING WIWNU (%) | 1.83 | 2.21 | 0.81 | 1.05 | 0.79 |

| TABLE 5 | EXAMPLE 8 | EXAMPLE 9 | EXAMPLE 10 | EXAMPLE 11 | COMPARATIVE EXAMPLE 2 |
|---|---|---|---|---|---|
| AFTER PRE-BAKING THE NUMBER OF PARTICLES (a.u.) | 2.61 | 1.16 | 1.0 | 1.86 | 1.16 |
| AFTER MAIN-BAKING THE NUMBER OF PARTICLES (a.u.) | 2.39 | 1.06 | 1.0 | 1.54 | 1.15 |
| THE NUMBER OF SCRATCHES (COUNT) | 13 | 0.8 | 0.6 | 3.6 | 16 |

SPIN-ON GLASS COMPOSITION AND METHOD OF FORMING SILICON OXIDE LAYER IN SEMICONDUCTOR MANUFACTURING PROCESS USING THE SAME

CROSS-REFERENCE OF RELATED APPLICATIONS

This application is a Continuation-in-part application of "METHOD OF FORMING SILICON OXIDE LAYER IN SEMICONDUCTOR MANUFACTURING PROCESS USING SPIN-ON GLASS COMPOSITION AND ISOLATION METHOD USING THE SAME METHOD", by the present inventors, Ser. No. 10/278,992, filed on Oct. 24, 2002 now U.S. Pat. No. 7,179,537, which itself is a Continuation-in-part application of "SPIN-ON GLASS COMPOSITION AND METHOD OF FORMING SILICON OXIDE LAYER IN SEMICONDUCTOR MANUFACTURING PROCESS USING THE SAME", by the present inventors, Ser. No. 09/686,624, filed on Oct. 12, 2000 now U.S. Pat. No. 6,706,646, the contents of both of which are herein incorporated by reference in their entirety. This application also relies for priority upon Korean Patent Application No. 2003-79508, filed Nov. 11, 2003, the contents of which are herein incorporated by reference in their entirety.

BACKGROUND OF THE INVENTION

1. Field of the Invention

The present invention relates to a spin-on glass (SOG) composition useful in forming a silicon oxide layer in a semiconductor manufacturing process, to a semiconductor device made thereby, and to a method of forming a silicon oxide layer using the same. More particularly, the present invention relates to a spin-on glass composition containing polysilazane, and its use in forming a silicon oxide layer in a semiconductor device.

2. Description of the Related Art

The design of semiconductor devices has recently made rapid progress. In particular, this progress has required semiconductor devices to function with high operating speed, and to have a large storage capacitance. In order to satisfy such requirements, semiconductor devices with increased density, reliability, and response time are under development.

Integrated circuits typically are manufactured by forming a large number of active devices on a single substrate. After each device is formed and insulated, some of the devices are electrically interconnected during the manufacturing process to accomplish a desirable circuit function. Metal Oxide Semiconductor (MOS) and bipolar VLSI and ULSI devices, for example, have multilevel interconnection structures in which a large number of devices are interconnected. In such a multilevel interconnection structure, the topography of the top layer usually is increasingly irregular and uneven as the number of layers increases.

For example, a semiconductor wafer with two or more metal layers typically is formed as follows. A number of oxide layers, a polycrystalline silicon conductive layer, and a first metal wiring layer are formed on a semiconductor wafer. A first insulation layer then is formed on the resulting structure. Then, a via hole is formed for providing circuit paths to a second metal layer. At this time, the surface of the first insulation layer is uneven because the layers underlying the first insulation layer are uneven. When the second metal layer is directly formed on the first insulation layer, the second metal layer may fracture due to protrusions or cracks in the underlying insulation layer. In addition, there may be a decreased yield of the semiconductor device if the deposition state of the metal layer is poor. Accordingly, the insulation layer typically is planarized before formation of the via hole or the second metal layer that will be formed in a multilevel metal interconnection structure.

Various methods have been developed to planarize the insulation layer. These methods include utilizing a borophosphorous silicate glass (BPSG) layer, which has good reflow characteristic, or an SOG layer and a chemical mechanical polishing (CMP) method. In general, BPSG is widely utilized as an insulation layer material to fill gaps between metal wirings. However, depositing BPSG presents problems because it depends primarily on establishing special deposition parameters for the equipment utilized. In addition, the gases used in the process are expensive and severely toxic.

Furthermore, as the packing density increases and the design rule gradually decreases for manufacturing VLSI having 256 megabits or more, using BPSG as the insulation layer to fill gaps between wirings lowers the yield due to the occurrence of voids and bridges. In addition, an etch stop layer may possibly be damaged during its subsequent formation. Thus, the prior art typically implements a reflowing process and an expensive CMP process to solve these problems.

An insulation layer formed by an SOG layer is known as being manufactured by a simple coating process. This process produces a planar insulation layer. For example, U.S. Pat. No. 5,310,720 (issued to Shin et al.) discloses a method for making a silicon oxide layer. A polysilazane layer is formed, and then the polysilazane layer is heated in an oxygen atmosphere to convert it into a silicon oxide layer. U.S. Pat. No. 5,976,618 (issued to Shunichi Fukuyama et al.) discloses a method in which an inorganic SOG is deposited, and then two step heat treatment processes are implemented to convert the SOG layer into a silicon oxide layer.

The basic backbone structure of polysilazane-based SOG is composed of Si—N, Si—H and N—H bonds. The Si—N bonds are converted into (or substituted with) Si—O bonds by baking under an atmosphere including oxygen and water. A simple spin coating and a simple curing process are performed to convert the SOG layer into the silicon oxide layer. Accordingly, it is an economical method.

Not all of the Si—N bonds, however, are converted to Si—O bonds (see, for example, Japanese Patent Laid-Open No. Hei 11-145286). Accordingly, the silicon oxide layer has different insulating and electrical characteristics when compared to a pure silicon oxide layer such as one formed using a BPSG. layer or a TEOS layer. For these reasons, many have avoided using the SOG layer to form a layer, and then convert it into a silicon oxide insulation layer. In addition, because SOG is deposited by a spin coating method, the thickness of the thus formed silicon oxide layer is not sufficient. This provides insufficient coverage for the conductive layers, such as gate electrodes and metal wirings.

The present Applicants have invented a spin-on glass composition including perhydropolysilazane which can bury a gap between metal wirings of VLSI degree having a high aspect ratio, can bury a gap on a substrate without applying a mechanical planarization, can smooth a surface discontinuities and can produce an oxide layer of a semiconductor device, having substantially the same characteristic as a CVD oxide layer, and filed a patent application concerning an invention entitled "SPIN-ON GLASS COMPOSITION AND METHOD OF FORMING SILICON OXIDE LAYER IN SEMICONDUCTOR MANUFACTURING PROCESS USING THE SAME", as a Ser. No. 09/686,624, on Oct. 12, 2000, with USPTO, which is now pending.

According to this method, a planar SOG layer is formed on a semiconductor substrate having a stepped portion or surface discontinuities by coating on the semiconductor substrate a spin-on glass composition including polysilazane having the chemical formula of —$(SiH_2NH_2)_n$— where n represents a positive integer, a weight average molecular weight within the range of about 4,000 to 8,000, and a molecular weight dispersion degree within the range of about 3.0 to 4.0. Finally, the SOG layer is cured to form a silicon oxide layer having a planar surface.

As for the silicon oxide layer, an isolation layer of an STI (shallow trench isolation) structure can be formed on a semiconductor substrate having a stepped portion formed by grooves and protrusions to form an isolation structure, can be illustrated.

The baking step is implemented by two steps of a pre-baking and a main-baking. The pre-baking of the SOG layer is implemented at a temperature within the range of about 100-500° C., more preferably in the range of about 100-400° C. for a period of about 1-5 minutes, more preferably of 2-3 minutes. The main-baking of the SOG layer is implemented at a temperature within the range of about 900-1,050° C.

At this time, the manufactured silicon oxide layer has a good gap filling characteristic for an STI structure including gaps having about 0.1-1 μm. However, according to a wet etching rate test, the etching rate decreases as the temperature of the main-baking increases, and a silicon oxide layer is formed at the surface portion of the silicon substrate and an active region.

FIG. 1 is a cross-sectional view of an oxide formed on an inner surface of a trench. The device illustrated in FIG. 1 is manufactured by the following method. A pad oxide layer is formed on a silicon substrate 100 and then, a nitride layer and a high temperature oxide layer are sequentially formed on the pad oxide layer. The nitride layer is provided as an etch stopping layer for the subsequently implementing chemical mechanical polishing process and the high temperature oxide layer is provided as a hard mask layer.

Next, an anti-reflective layer (not shown) is formed on the high temperature oxide layer by depositing a silicone oxynitride compound (SiON) and a high temperature oxide layer pattern 116 is formed for defining an active pattern by utilizing a photolithography.

The nitride layer and the pad oxide are etched by using the high temperature oxide layer pattern 116 as an etching mask to form a nitride layer pattern 114 and a pad oxide layer pattern 112. Then, an upper portion of the substrate 100 adjacent to the nitride layer pattern 114 is etched to form a trench 118.

Subsequently, an exposed portion of the trench 118 is heat treated under an oxidizing atmosphere to cure a silicon damage induced by an ion impaction of a high energy during the etching process of the trench. Then, a trench inner wall oxide layer 120 is formed at the inner portion of the trench 18 including the bottom and side portions thereof by an oxidation reaction of the exposed silicon with an oxidizing agent.

Next, the SOG composition suggested by the present Applicants is deposited on the semiconductor substrate 100 to fill the trench 118 and to form an SOG layer. Then, the SOG layer is baked. A pre-baking is implemented at a temperature range of about 100-500° C., preferably about 100-400° C. for about 1-5 minutes, preferably for about 2-3 minutes. A main-baking is implemented at a temperature range of about 900-1050° C. to form silicon oxide. Then, an oxide layer 130 burying the trench is manufactured as illustrated in FIG. 1. The oxide layer 130 is formed from the SOG layer. At this time, it is known that the trench inner wall oxide layer 120 at the side wall portion is thicker than that at the bottom portion, as designated by a circle. The oxide compound is thought to be formed by an oxidation reaction of silicon in the substrate 100 with oxygen contained in the oxidizing atmosphere when baking at 1000° C. or more under the oxidizing atmosphere.

The generation of the oxide might induce a shape defect at a dent portion after implementing a CMP process or might change the size of the active region.

The present Applicants have also invented a spin-on glass composition including perhydropolysilazane which can bury a gap between metal wirings of VLSI degree having a high aspect ratio, can bury a gap on a substrate without applying a mechanical planarization, can smooth a surface discontinuities and can produce an oxide layer of a semiconductor device, having substantially the same characteristic as a CVD oxide layer, and filed a patent application concerning an invention entitled "METHOD OF FORMING SILICON OXIDE LAYER IN SEMICONDUCTOR MANUFACTURING PROCESS USING SPIN-ON GLASS COMPOSITION AND ISOLATION METHOD USING THE SAME METHOD", by the present inventors, Ser. No. 10/278,992, filed on Oct. 24, 2002, with the USPTO, which is now U.S. Pat. No. 6,479,405.

SUMMARY OF THE INVENTION

Accordingly, it is a feature of an embodiment of the present invention to provide a spin-on glass composition that fills gaps between closely-spaced metal wirings of semiconductor devices having a high packing density and a large aspect ratio. It is also a feature of the present invention to provide a composition that fills gaps or smoothes surface discontinuities on a substrate without the need for mechanical planarization. It also is a feature of the invention to provide a spin-on glass composition that has substantially the same characteristics as an oxide layer of a semiconductor device formed by a chemical vapor deposition (CVD) method. It is another feature of the invention to provide a method of forming an oxide layer in a semiconductor manufacturing process using the above spin-on glass composition.

In accordance with these and other features of the invention, there is provided a spin-on glass composition containing polysilazane having the compound formula —$(SiH_2NH)_n$— wherein n represents a positive integer, in an amount of about 10 to about 30% by weight, based on the total weight of the composition, whereby the polysilazane has a weight average molecular weight within the range of about 3,000 to about 6,000 and a solvent in an amount of about 70 to about 90% by weight, based on the total weight of the composition.

In accordance with another feature of the invention, there is provided a method of forming a silicon oxide layer. The method entails coating a semiconductor substrate having a stepped portion with a spin-on glass (SOG) composition including polysilazane having the compound formula —$(SiH_2NH)_n$— wherein n represents a positive integer, in an amount of about 10 to about 30% by weight, based on the total weight of the composition, whereby the polysilazane has a weight average molecular weight within the range of about 3,000 to about 6,000, and a solvent in an amount of about 70 to about 90% by weight, based on the total weight of the composition to form a SOG layer on the semiconductor substrate and curing the SOG layer to form a silicon oxide layer.

According to various embodiments of the present invention, a uniform silicon oxide layer having substantially no voids can be formed by utilizing an SOG composition that completely covers a conductive layer having an aspect ratio of about 5:1 to 10:1 or other surface discontinuities.

BRIEF DESCRIPTION OF THE DRAWINGS

The above features and advantages of the present invention will become more apparent by describing in detail, preferred embodiments thereof with reference to the attached drawings in which.

DESCRIPTION OF ILLUSTRATIVE EMBODIMENTS

Figure 1:
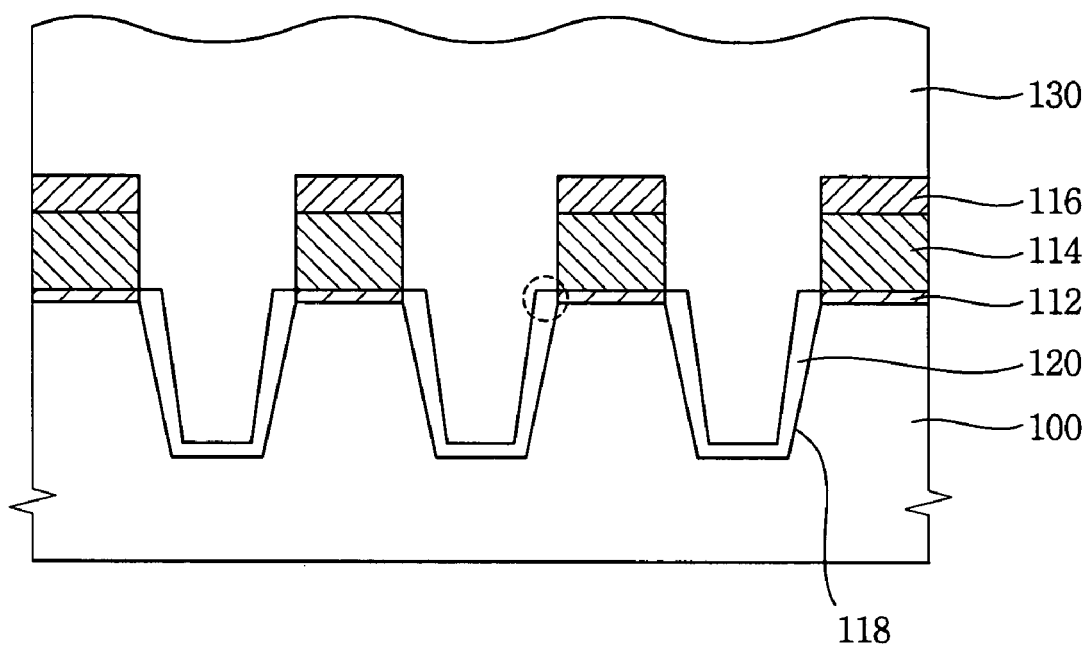
FIG. 1 is a cross-sectional view showing an oxide formed at the inner wall of a trench when an SOG layer is baked by one heat treating process.

The present invention now will be explained in more detail with reference to the attached drawings.

Whenever it is stated that a material, layer, or structure is formed or deposited on or over another material, structure, or layer; another layer, material, or structure may be intervening.

The spin-on glass composition used in the present invention is disclosed in the above U.S. patent application Ser. No. 09/686,624 and preferably includes polysilazane having the formula —$(SiH_2NH_2)_n$— where n represents a positive integer, a weight average molecular weight within the range of about 4,000 to 8,000, and a molecular weight dispersion degree within the range of about 3.0 to 4.0. Throughout this description, the expression "molecular weight dispersion degree" denotes the ratio of weight average molecular weight to number average molecular weight.

Methods of making polysilazane are widely known. By one typical method, polysilazane is prepared by reacting halosilane with a Lewis base to obtain a complex compound and then reacting the complex compound with ammonia. Polysilazane also can be prepared by: (i) reacting a silicone halide such as $SiCl_4$ or $SiH_2Cl_2$ with amine; (ii) converting silazane into polysilazane utilizing an alkaline metal halide catalyst; (iii) dehydrogenating from a silane compound utilizing a transition complex metal compound and an amine compound; or the like.

U.S. Pat. No. 5,494,978 (issued to Yasuo Shinizu et al.) discloses a method of preparing a defoamed polysilazane utilizing inorganic polysilazane having a number average molecular weight of 100-100,000. U.S. Pat. No. 5,905,130 (issued to Hirohiko Nakahara et al.) discloses a method of preparing polysilazane by reacting a polyaminosilane compound with a polyhydrogenated nitrogen-containing compound in the presence of a base catalyst, or by reacting a polyhydrogenated silicone compound with a polyhydrogenated nitrogen-containing compound under a basic solid oxide catalyst. U.S. Pat. No. 5,436,398 (issued to Yasuo Shimizu et al.) discloses a method of preparing perhydropolysilazane having a number average molecular weight of about 1,120. U.S. Pat. No. 4,937,304 (issued to Ayama et al.) and U.S. Pat. No. 4,950,381 (issued to Takeuchi et al.) disclose methods for preparing polysilazanes having desired molecular weights. The disclosures of each of the aforementioned documents are incorporated by reference herein in their entirety.

The polysilazane utilized in the present invention can be prepared by any of the methods described above without limitation. In order to be used in various embodiments of the present invention, perhydropolysilazane prepared by the above methods preferably is fractionated according to its molecular weight. When the weight average molecular weight is below about 4,000, the outgassing amount may be increased, and the perhydropolysilazane may be converted into silicon oxide too rapidly which can generate cracks due to the low molecular weight. On the other hand, when the weight average molecular weight exceeds 8,000, the viscosity of the SOG solution may increase, which deteriorates the uniformity of the thus formed SOG layer. Accordingly, the weight average molecular weight of perhydropolysilazane used in the present invention preferably is in the range of about 4,000 to 8,000. More specifically, the weight average molecular weight of perhydropolysilazane is in the range of about 6,000 to 8,000 when an SOG layer is formed to bury a trench, and more preferably, in the range of about 6,500 to 7,000.

In other embodiments, when perhydropolysilazane utilized in the present invention has low weight average molecular weight of below about 3,000, an outgassing amount may be increased and $SiH_4$ separated from perhydropolysilazane may be reacted with an oxygen gas to form particles including $SiO_2$, thereby contaminating a reaction chamber. These particles may contaminate a wafer during subsequent manufacturing processes. On the other hand, when the weight average molecular weight of perhydropolysilazane exceeds about 6,000, the viscosity of SOG solution may increase, which deteriorates the uniformity of the thus formed SOG layer. Accordingly, perhydropolysilazane used other embodiments of the present invention preferably has weight average molecular weight is in a range of about 3,000 to about 6,000, and more preferably, in a range of 3,300 to 3,700.

In addition, when the molecular weight dispersion degree of polysilazane, which is the ratio of weight average molecular weight to number average molecular weight, is below 3.0, the fractionation efficiency of polysilazane and the yield of fractionated polysilazane may be low. On the other hand, when the molecular weight dispersion degree exceeds 4.0, the converted silicon oxide layer may not be uniform. Accordingly, the molecular weight dispersion degree of polysilazane useful in the invention preferably is within the range of about 3.0 to 4.0, although conditions may exist for utility of the composition outside of this range. However, polysilazane having the molecular weight dispersion degree out of the range also can be used when occasion needs.

In addition, perhydropolysilazane used in other embodiments of the present invention preferably has molecular weight distribution degree of about 2.5 to about 3.5, more preferably about 2.8 to about 3.2. The molecular weight distribution degree of perhydropolysilazane is about 2.5 to about 3.5 when the weight average molecular weight of perhydropolysilazane is about 3,000 to about 6,000. When the molecular weight distribution degree of perhydropolysilazane, is below about 2.5, the fractionation efficiency of perhydropolysilazane may be reduced to low the yield of fractionated perhydropolysilazane. On the other hand, when the molecular weight dispersion degree exceeds about 3.5, the conversion of silicon oxide may be disadvantageously uon-uniform.

An SOG composition preferably is an SOG solution prepared by dissolving the aforementioned polysilazane in a solvent, preferably an organic solvent. Any of a variety of organic or other solvents may be used in the present invention without limitation. Useful solvents preferably include an aromatic solvent, such as xylene, or an ether solvent, such as dibutyl ether. When the amount of polysilazane in the SOG solution exceeds 30% by weight, the polysilazane may, but not necessarily, have increased instability, the lifetime of the solution may decrease, and cracks may be formed. When the amount of polysilazane in the SOG solution is below 10% by weight, it may, but not necessarily, become difficult to control the thickness of the SOG layer. Accordingly, the amount of polysilazane in the SOG solution preferably is within the range of 10 to 30% by weight, based on the total weight of the composition, and more preferably, the amount is within the range of 18 to 25% by weight. It also is preferred that the solvent in the SOG solution be within the range of 70 to 90% by weight based on the total weight of the composition, and more preferably, within the range of 72 to 82% by weight.

The preferred contact angle of the SOG composition with an underlying layer, such as a silicon nitride layer, preferably is no more than 4°. The adhesion of the SOG composition with the underlying layer may be insufficient when the contact angle exceeds 4°.

As set forth above, an SOG composition, preferably an SOG solution, is prepared by dissolving the aforementioned perhydropolysilazane in a solvent such as an organic solvent. Any of a variety of organic or other solvents may be used in the present invention without limitation. Useful solvents preferably include an aromatic solvent such as xylene, or an ether solvent such as dibutyl ether. When the amount of perhydropolysilazane in the SOG solution exceeds about 30% by weight, perhydropolysilazane may have increased instability, the lifetime of the solution may decrease, and also cracks may be formed. When the amount of perhydropolysilazane in the SOG solution is below about 10% by weight, it may become difficult to control the thickness of an SOG layer. Accordingly, in other embodiments of the present invention, the amount of perhydropolysilazane in the SOG solution preferably is in the range of about 10 to about 30% by weight, more preferably about 20 to 23% by weight, based on the total weight of the SOG composition. The preferred contact angle of the SOG composition with an underlying layer such as a silicon nitride layer preferably is no more than about 4°. The adhesion strength of the SOG composition with the underlying layer may be insufficient when the contact angle exceeds about 4°.

Figure 2:
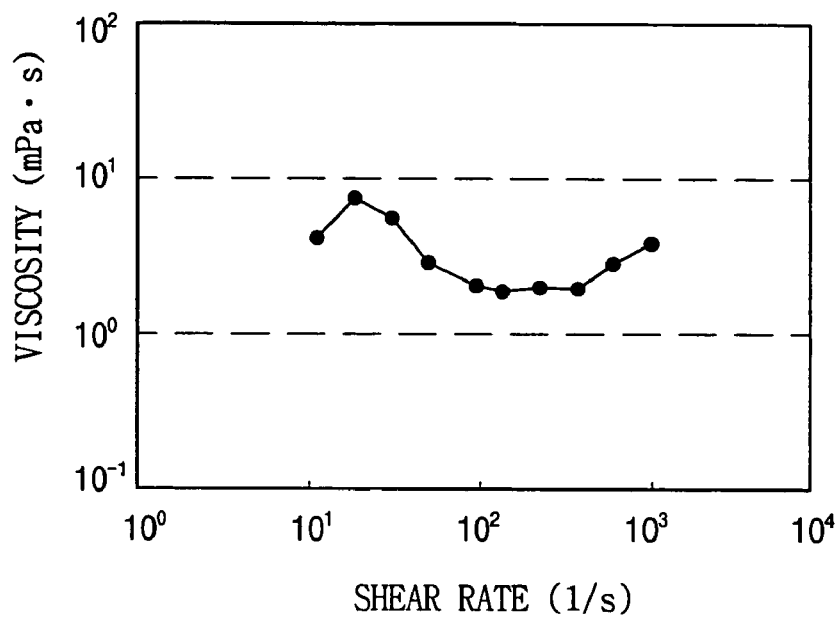
FIG. 2 is a graph illustrating the relationship between viscosity and shear rate of an SOG composition of the present invention.

To achieve surface uniformity during the coating and curing process, the SOG solution preferably has a viscosity within the range of about 1 to 10 mPa.s, and more preferably, within the range of 1 to 8 mPa.s, at a predetermined shear rate. FIG. 2 is a graph illustrating the relationship between viscosity and shear rate of the SOG solution. In the graph of FIG. 2, the ordinate represents the viscosity (mPa.s), and the abscissa represents the shear rate (1/s). The viscosity of the SOG solution according to the present invention preferably is within the range of about 1 to 10 mPa.s, at a shear rate of 54-420 (1/s), as shown in FIG. 2. It also can be seen from FIG. 2 that the viscosity of the SOG composition may be within the range of about 1 to about 10 mPa.s, at a shear rate within the range of 10 to 1,000 (1/s).

The viscosity of the SOG composition affects on flowability of the SOG composition and determines the flatness of an oxide layer. The viscosity of the SOG composition increases according as the weight average molecular weight of perhydropolysilazane increases. When perhydropolysilazane has weight average molecular weight of about 3,000 to about 6,000, the viscosity of the SOG composition is about 1.54 to about 1.70 mPa.s (cP).

The SOG solution may include at least one impurity compound including an element selected from boron, fluorine, phosphor, arsenic, carbon, oxygen, and mixtures thereof, as the occasion needs. When at least an element selected from boron, fluorine, phosphor, and arsenic is included in the SOG solution among the impurity materials, a silicon oxide layer formed from the SOG solution will include the impurity material, and the layer may have characteristics similar to a conventional boron silicate glass (BSG) layer, BPSG layer, phosphorous silicate glass (PSG) layer, or the like. Conversion of SOG into a silicon oxide layer may be promoted when at least one of carbon and/or oxygen is included in the SOG solution as an impurity.

The SOG solution preferably is coated by a spin coating method onto a semiconductor substrate having surface discontinuities, such as conductive line patterns. This method is particularly useful in forming a planar SOG layer.

The surface discontinuity on the semiconductor substrate may result from conductive patterns. For example, conductive metal wiring patterns, such as gate electrode patterns or bit lines, result in stepped portions on the surface of the substrate. The distance between the two conductive patterns is not limited. In general, however, when the distance is greater than 1 μm, but conventional methods of forming an oxide layer utilizing BPSG are adequate, but when the distance approaches 0.04 μm, for example, the method utilizing the SOG solution of the present invention offers greater possibilities of void filling. Accordingly, the method of the present invention preferably is applied to a semiconductor substrate having gaps of about 0.04-1 μm.

The method of various embodiments of the present invention may also be applied to conductive pattern gaps of low aspect ratio (wherein the aspect ratio represents the ratio of the depth with respect to the distance of the gap). However, a conductive pattern having an aspect ratio of about 5:1 to about 10:1 preferably is applied in various embodiments of the invention.

Generally, closely spaced gaps in which conductive patterns are closely formed, such as a cell array region including gate electrodes, can be formed on a semiconductor substrate. In addition, a global stepped portion (or a sparsely separated gap portion) in which conductive patterns are sparsely formed, such as a peripheral circuit region, also can be formed on a semiconductor substrate. The present invention can be applied to a semiconductor substrate having closely spaced gaps with an aspect ratio within the range of from about 5:1 to about 10:1, and sparsely spaced stepped portions with an aspect ratio of about 1:1 or less.

Stepped portions also result from prominence/recess portions of the semiconductor substrate. In particular, an oxide layer can be formed by the method of the present invention, whereby the layer preferably is formed on stepped portions of the semiconductor substrate having grooves and protrusions. Forming the oxide layer in this manner is useful for manufacturing an isolation region having a shallow trench isolation (STI) structure. In addition, stepped portions result from metal wirings formed on an insulation layer. That is, a silicon oxide layer formed by the method of the present invention can be utilized as an insulation interlayer for insulating metal wirings formed on the insulation layer.

The curing method of the coated SOG layer will be described in detail, below.

Advantageously, the SOG layer formed by the above method can be cured to thereby convert it into a silicon oxide layer with a planar surface. The curing step is performed by pre-baking and main-baking. Based on the teachings herein, those skilled in the art are capable of curing the SOG layer, and converting it into a silicon oxide layer having a planar surface.

The pre-baking preferably is performed at a temperature within the range of about 100 to 500° C. for about 1-5 minutes. When the pre-baking temperature is below 100° C., organic solvent may possibly remain in the layer, and not be removed. On the other hand, when the pre-baking temperature is over 500° C., polysilazane at or below a certain depth may not be completely converted into silicon oxide at the subsequent main-baking procedure, and the surface portion may be rapidly converted into silicon oxide, which can generate cracks, thereby causing non-uniformity in a consequent silicon oxide layer.

When pre-baking is performed for less than one minute, organic solvents may remain in the layer, and not be fully removed. On the other hand, when pre-baking is performed for more than 5 minutes, a partial conversion into silicon oxide may occur at the surface of the SOG layer including perhydropolysilazane, thereby forming a partial crack even if the organic solvent was completely removed. Therefore, pre-baking preferably is performed at a temperature within the range of about 100 to 500° C., and for a period of time from about 1 to 5 minutes, and more preferably at a temperature within the range of 100 to 400° C., and for a period of time within the range of about 2 to 3 minutes.

The main baking preferably is conducted at a higher temperature and for a longer time, when compared to the pre-baking. The basic backbone structure of polysilazane-based SOG includes Si—N bonds. These Si—N bonds may be substituted with (or converted into) Si—O bonds by baking in an atmosphere including oxygen and water. According to conventional methods employing spin-on glass compositions described previously, not all of the Si—N bonds become substituted with Si—O bonds, and therefore, some Si—N bonds remain in the Si—O layer after coating the SOG solution and subsequent baking. In accordance with a method of present invention, however, no Si—N bonds remain after coating the SOG solution including polysilazane to form the SOG layer and implementing the curing process. Accordingly, the silicon oxide layer formed by various embodiments of the invention has substantially the same characteristics as a pure silicon oxide layer formed by conventional CVD methods.

The main baking preferably is conducted at a temperature within the range of about 400 to 1,200° C. in order to convert polysilazane into silicon oxide. When the main baking temperature is below 400° C., curing may not be sufficient, and some Si—N bonds may remain thereby deteriorating the characteristics of the oxide layer. On the other hand, when the main baking temperature is over 1,200° C., the planarity of the thus formed silicon oxide layer may be lowered or cracks may occur. Therefore, main baking preferably is carried out at temperatures within a range of about 400 to 1,200° C., and more preferably, at temperatures within the range of about 400 to 1,000° C.

Furthermore, main baking preferably is conducted for a period of time ranging from about 10 to 180 minutes. When the main baking time is less than 10 minutes, the SOG layer may not be sufficiently converted into the silicon oxide layer. On the other hand, when the main-baking time exceeds 180 minutes, stress in the thus formed silicon oxide layer increases. Therefore, the main baking preferably is carried out for a period of time within the range of about 10 to 180 minutes, and more preferably within the range of 30 to 120 minutes.

The main baking preferably is carried out in an oxidizing atmosphere, or in an inert atmosphere that is appropriate for converting Si—N bonds into Si—O bonds. For example, useful environments for the main baking procedure include an atmosphere of oxygen, an atmosphere including water vapor, an atmosphere including a mixture of oxygen and water vapor, an atmosphere including nitrogen, and mixtures of these atmospheres. An atmosphere including water vapor is preferred, and it preferably contains from about 1.2 to about 86% by weight of water.

The temperature range of the main baking can be determined by considering its effect on an underlying structure. For example, when the underlying structure includes a trench formed by partially etching an upper portion of a semiconductor substrate and the SOG layer is formed to fill up the trench, the preferred temperature range of the main baking of the curing process is within the range of about 900 to 1,200° C. When the underlying structure includes a plurality of gate electrodes formed on the semiconductor substrate and the SOG layer is formed to completely cover the gate electrodes, the preferred temperature range of the main baking is within the range of about 600 to 900° C. When the underlying structure includes a plurality of metal wiring patterns formed on an insulation layer disposed on the semiconductor substrate, and the SOG layer is formed to completely cover the metal wiring patterns, the preferred temperature range of the main baking is within the range of about 400 to 450° C. Those skilled in the art are capable of determining the appropriate temperature range for the main baking, using the guidelines provided herein. Thus the specific ranges of parameters set forth in this specification are not intended to limit the invention.

One coating of the SOG composition typically provides a silicon oxide layer having a thickness within the range of about 4,000 to 6,500 Å. Before coating the SOG composition, a silicon nitride layer having a thickness within the range of about 200 to 600 Å can be formed as an etch stop layer on the upper and side portion of the conductive patterns.

The SOG composition can be utilized for burying a trench or planarizing gate electrodes and/or metal patterns during the manufacture of a semiconductor device. Otherwise, the SOG composition can be utilized for burying the trench, while the conventional SOG composition or other method can be utilized for planarizing the gate electrodes and/or metal patterns. That is, the SOG composition can be applied for burying the trench or for planarizing the gate electrodes and/or metal patterns, and it should be understood that one of these two processes can be applied.

According to another embodiment of the present invention, the main baking process can be implemented in two-step heat treatment processes. When the heat treatment is implemented by one step, the measure at the active region might be changed by forming silicon oxide at the side wall of the trench through a reaction of a silicon source supplied from a semiconductor substrate with oxygen contained in an oxidizing atmosphere, as described above with reference to FIG. 1. Accordingly, when an SOG layer is formed by curing an SOG composition including polysilazane on a substrate from which a silicon source is provided, the heat treatment should be implemented in two steps in order to convert the SOG layer into silicon oxide.

First, the first heat treatment onto the SOG layer is implemented to convert polysilazane into oxide. At this time, the first heat treatment is implemented under an oxidizing atmosphere such as an oxygen atmosphere, a humidity atmosphere and a mixed atmosphere of oxygen and humidity, in a temperature range of about 500-1,000° C., more preferably about 600-900° C. Most preferably, the first heat treatment is implemented in a temperature range of about 800-900° C. for about 10-120 minutes.

Next, the second heat treatment onto thus obtained oxide from the first heat treatment is implemented under an oxidizing atmosphere, an inert gas atmosphere, a mixed atmosphere of the oxidizing atmosphere and the inert gas atmosphere, or vacuum to densify the convert oxide. Particularly, the second heat treatment is preferably implemented under an inert gas atmosphere including nitrogen. And the second heat treatment is preferably implemented at a temperature range of about 600-1200° C., and more preferably about 900-1100° C. for about 10-120 minutes.

In particular, when the SOG layer is formed to bury a trench manufactured by partially etching an upper portion of the semiconductor substrate, the second heat treatment of the main baking is preferably implemented at a temperature range of about 900-1100° C.

Aspects of the present invention now will be explained with reference to the following non-limiting examples.

EXAMPLE 1

Preparation of an SOG Composition

Perhydropolysilazane having a weight average molecular weight of 4,500-7,000 and a molecular weight dispersion degree of 3.0-4.0 was obtained by fractionating commercially available perhydropolysilazane. The fractionated perhydropolysilazane was dissolved in xylene to obtain an SOG composition having a perhydropolysilazane concentration of 22-25% by weight, based on the total weight of the composition. The contact angle of the SOG composition was 4° or less with respect to an underlying silicon nitride layer.

The viscosity of the SOG composition was detected according to the variation of its shear rate. The viscosity characteristic is illustrated in FIG. 2. FIG. 2 is a graph illustrating the viscosity change with respect to the shear rate change of the SOG solution. The ordinate represents the viscosity (mPa.s) and the abscissa represents the shear rate (1/s). As can be seen in FIG. 2, the SOG solution preferably has a uniform viscosity within the range of about 1 to 10 mPa.s, at a shear rate of about 10 to 1,000 (1/s), more preferably at a shear rate of about 54 to 420 (1/s).

Formation of an Oxide Layer

Figure 3A:
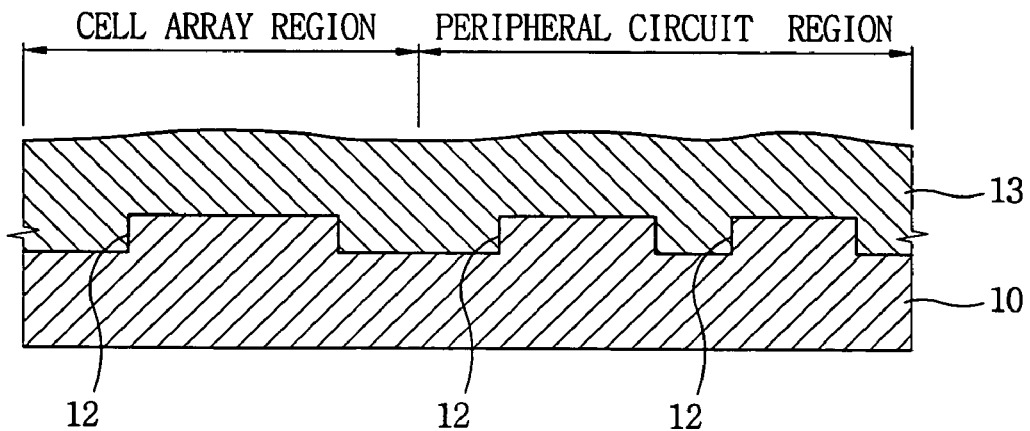
FIGS. 3A-3K are cross-sectional views illustrating a method of forming a silicon oxide layer in a semiconductor manufacturing process according to an embodiment of the invention.

FIGS. 3A-3K are cross-sectional views illustrating a method of forming a silicon oxide layer in a semiconductor manufacturing process according to an embodiment of the present invention. Referring to FIG. 3A, there is provided a p-type substrate 10 formed of a semiconductor material, such as silicon (Si). Trenches 12 were formed on the substrate 10 by etching an isolation region. The depth of trench 12 was about 4,600 Å, and the width thereof was about 1,250 Å. On the substrate 10 on which the trenches 12 were formed, the SOG solution including perhydropolysilazane of which weight average molecular weight is in the range of 6,000-8,000 and prepared as above was coated to a thickness of about 6,000 to 7,000 Å to form a first SOG layer 13.

Figure 3B:
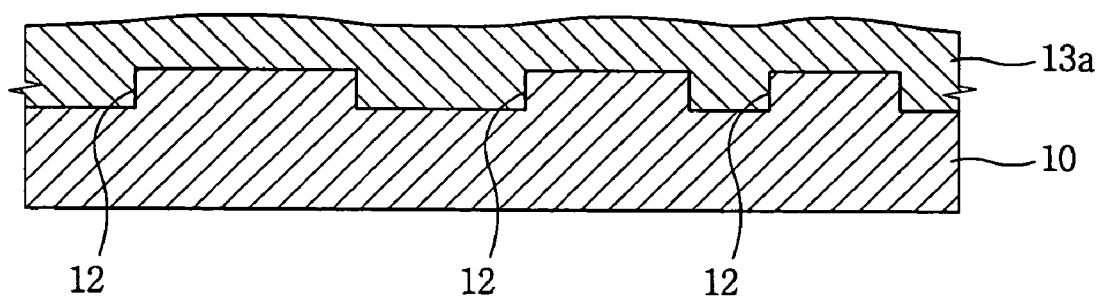
Figure 3C:
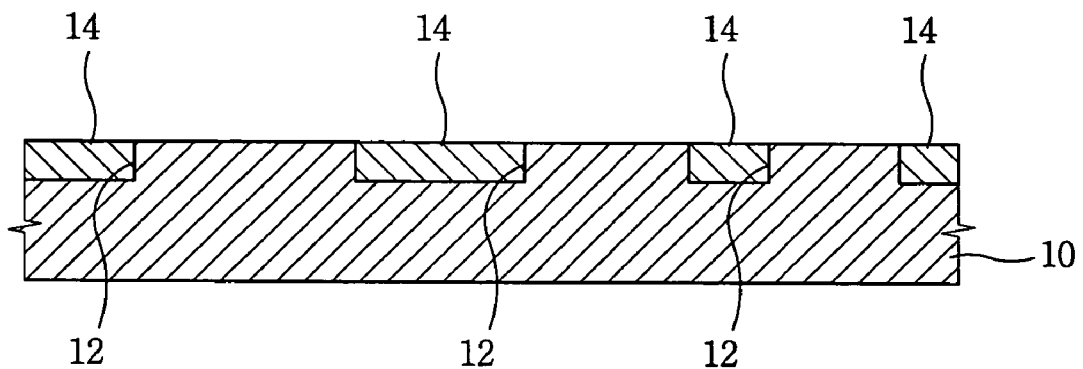

Referring now to FIG. 3B, the first SOG layer 13 was pre-baked at about 100 to 500° C. for 1-5 minutes, and then main-baked at about 900 to 1,000° C. for 30 minutes to convert the first SOG layer 13 into a first silicon oxide layer 13a. At this time, the baking was implemented under a water vapor atmosphere having a water content of about 86% by weight. Referring to FIG. 3C, the silicon oxide layer 13a was polished by a CMP method until the upper surface of the semiconductor substrate 10 was exposed to form device isolation regions where the inside portions of trenches 12 were filled with silicon oxide 14.

Figure 3D:
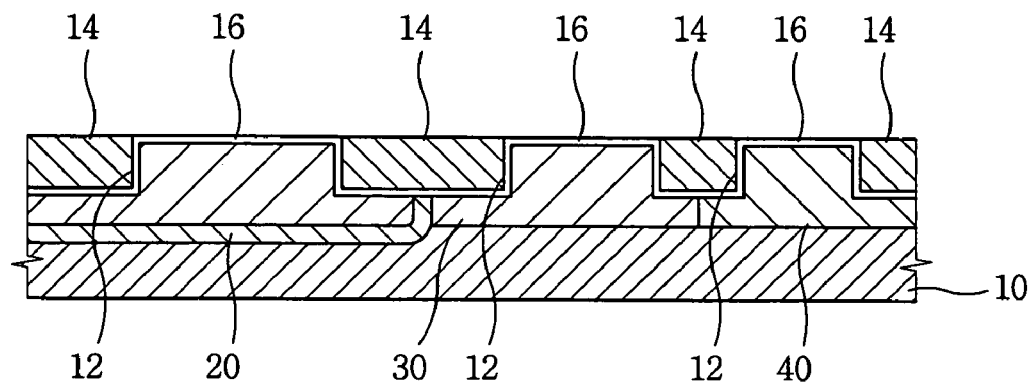

Referring to FIG. 3D, an n-type semiconductor region 20 was formed by doping an n-type impurity, such as phosphorous (P) ions, into a region for forming memory cells of the semiconductor substrate 10 (cell array region). In addition, a p-type well 30 was formed by doping a p-type impurity, such as boron (B) ions, into the cell array region and a portion of the peripheral circuit region. Finally, an n-type well 40 was formed by doping an n-type impurity, such as phosphorous (P) ions, into the remaining region of the peripheral circuit region.

Next, an impurity for controlling a threshold voltage, such as boron fluoride ($BF_2$) was doped into the p-type well 30 and the n-type well 40. Thereafter, each surface portion of the p-type well 30 and the n-type well 40 was cleaned utilizing a fluorine-based cleaning solution. The semiconductor substrate 10 then was wet oxidized to form a gate oxide layer 16 on each surface of the p-type well 30 and the n-type well 40. At this time, portions of the substrate within trenches 12 also were partially oxidized to from a continuous gate oxide layer 16. The thickness of the gate oxide layer 16 was about 40-200 Å.

Figure 3E:
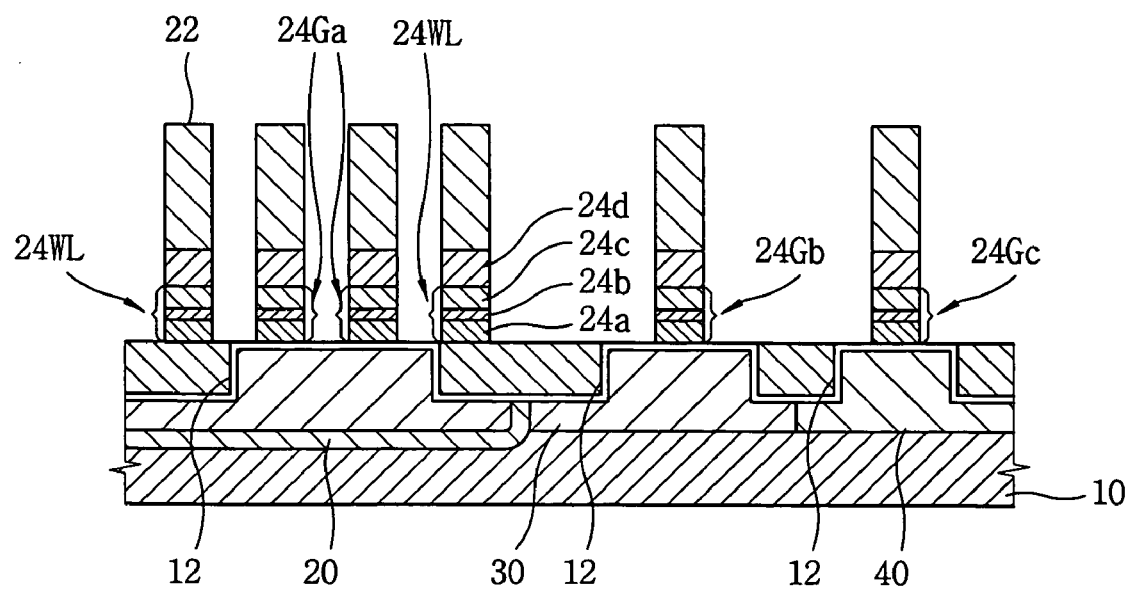

Referring to FIG. 3E, a polysilicon layer was formed on the substrate 10, in which the silicon oxide 14 that filled the trenches 12 as a field oxide, and gate oxide layer 16 were formed. The polysilicon layer had a thickness of about 500 to 4,000 Å, and was formed by depositing polycrystalline silicon doped with an n-type impurity, such as phosphorous (P) ions, by a low pressure chemical vapor deposition (LPCVD) method. Then, tungsten silicide and tungsten were deposited by a sputtering method on the polysilicon layer to form a tungsten silicide layer and a tungsten layer which had respective thickness of about 1,000 to 2,000 Å. A silicon nitride layer then was deposited on the tungsten layer. The silicon nitride layer was formed to have a thickness of about 500 to 2,000 Å by a LPCVD, or a plasma enhanced chemical vapor deposition (PECVD) method. Skilled artisans are capable of forming the respective layers, using the guidelines provided herein.

A photoresist film then was formed on the silicon nitride layer, and the photoresist film was selectively exposed by utilizing a mask. Then, the photoresist film was developed to form a photoresist pattern 22 for forming gate electrodes. The silicon nitride layer, tungsten-layer, tungsten nitride layer, and polysilicon layer then were etched one by one by utilizing the photoresist pattern 22 as an etching mask to form gate electrodes 24Ga, 24Gb, 24Gc and 24GWL composed of a polysilicon pattern 24a, a tungsten silicide pattern 24b, tungsten pattern 24c, and silicon nitride pattern 24d. Gate electrodes 24Ga and word lines 24GWL were formed at the cell array region, and gate electrodes 24Gb and 24Gc were formed at the peripheral circuit region.

The gate electrodes 24Ga and 24GWL formed on the cell array region were manufactured so that the gaps between the gate electrodes were in the range of about 0.4 to 1 µm. The aspect ratio, which is the ratio of the depth with respect to the gap width of gate electrodes 24Ga and 24GWL, was within the range of about 5:1 to 10:1 thereby forming a closely stepped portion. On the other hand, the aspect ratio of the gate electrodes 24Gb and 24Gc formed on the peripheral circuit region, was less than 1:1 thereby forming a global stepped portion.

Figure 3F:
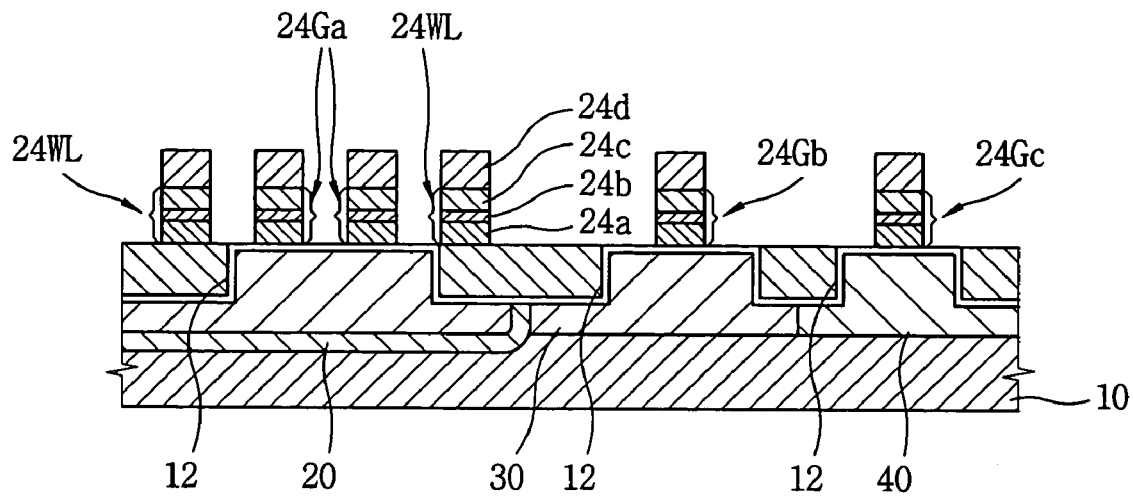

Referring to FIG. 3F, the photoresist pattern 22 was removed. In FIG. 3F, a p-type impurity doped region 25 was formed in the n-type well 40 at both sides of the gate electrode 24Gc by doping a p-type impurity, such as boron ions, into the n-type well 20. Also, an n-type impurity doped region 27 was formed in the p-type well 30 at both sides of the gate electrode 24Gb by doping an n-type impurity, such as phosphorous ions, into the p-type well 30. An n-type impurity doped region 26 was formed in the p-type well 20 at both sides of gate electrodes 24Ga.

Figure 3G:
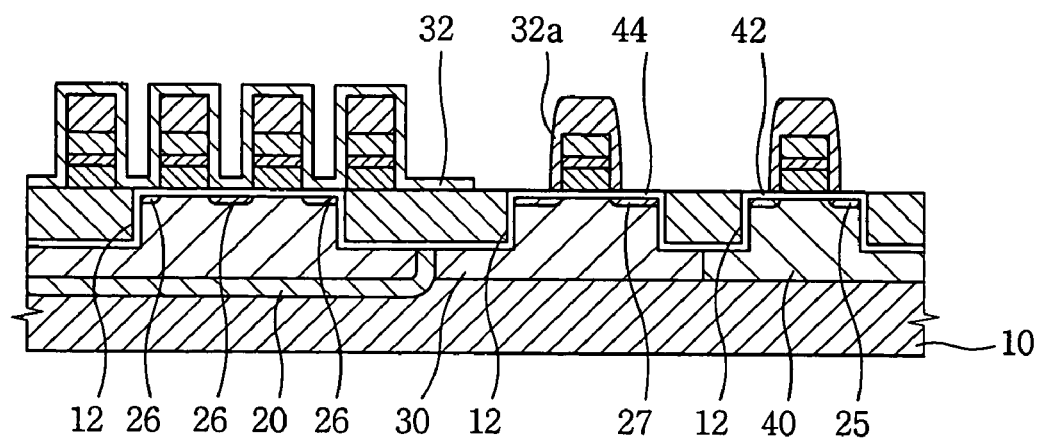

Referring to FIG. 3G, silicon nitride was deposited on the semiconductor substrate 10 by a chemical vapor deposition method to form a silicon nitride layer 32 having a thickness of about 200-600Å. Next, the silicon nitride layer 32 on the cell array region was covered with a photoresist film, and the silicon nitride layer 32 on the peripheral circuit region was anisotropically etched to foim a spacer 32a on side walls of the gate electrodes 24Gb and 24Gc (FIG. 3F) of the peripheral circuit region. Reference numerals 42 and 44 refer to impurity regions in the n-type well 40.

Next, a p+-type impurity doped region (source, drain regions) was formed by doping a p-type impurity, such as boron ions, into the n-type well 40 of the peripheral circuit region. In addition, an n+-type impurity doped region (source, drain regions) was formed by doping an n-type impurity, such as arsenic (As) ions, into the p-type well 30 of the peripheral circuit region.

Figure 3H:
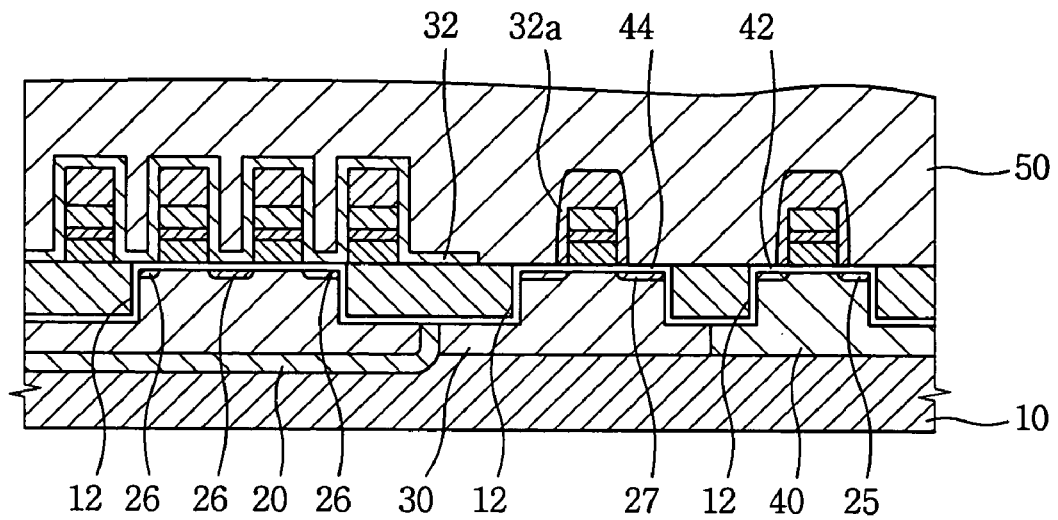

Referring to FIG. 3H, an SOG solution was coated on the semiconductor substrate 10 to form a second SOG layer 50. The second SOG layer 50 was formed by a spin coating method, whereby the rotational velocity of the wafer was about 500-2,500 rpm. The weight average molecular weight of perhydropolysilazane contained in the SOG solution was about 4,000-6,000. The thickness of the second SOG layer 50 was in the range of about 7,500 to 8,200 Å. The second SOG layer 50 completely covered the gate electrodes 24Ga, 24Gb, 24Gc and 24GWL. Next, the second SOG layer 50 was pre-baked at a temperature within the range of about 100 to 500° C. for about 1 to 5 minutes, and then was main-baked at a temperature within the range of about 600 to 900° C. for about 10 to 180 minutes. The baking was conducted under at least one atmosphere selected from an oxygen atmosphere, a water vapor atmosphere, an atmosphere containing a mixture of oxygen and water vapor, a nitrogen atmosphere, or mixtures thereof. When the baking was implemented in a water vapor atmosphere, the water content in the atmosphere was controlled to be within the range of about 1.2-86% by weight.

Figure 3I:
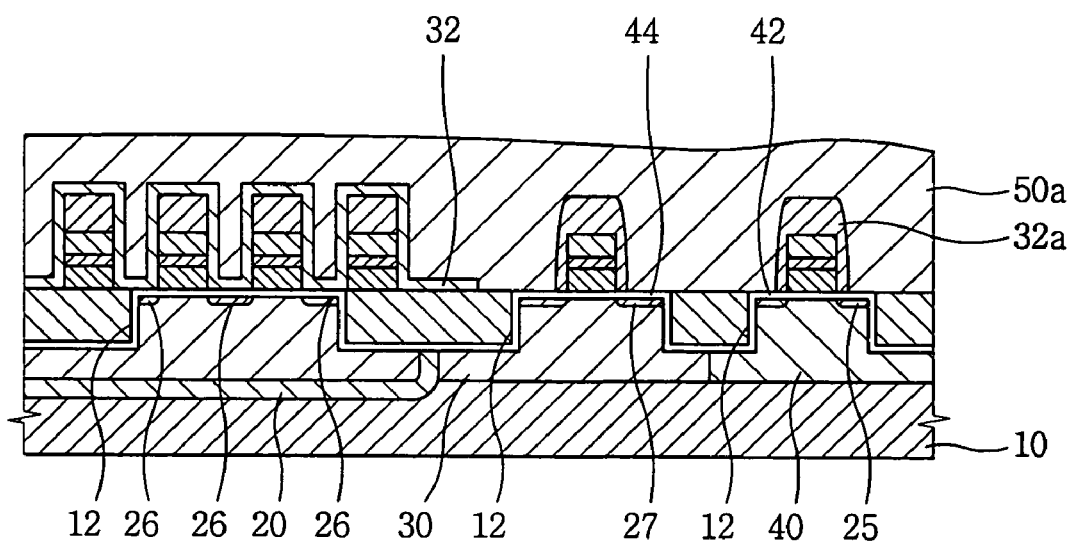

During the curing process, Si—N bonds in the second SOG layer 50 were substituted with Si—O bonds to convert the second SOG layer 50 into a silicon oxide layer 50a. The thickness of second silicon oxide layer 50a decreased by about 19-20% of the thickness of second SOG layer 50 during this process, as shown in FIG. 3I.

Figure 3J:
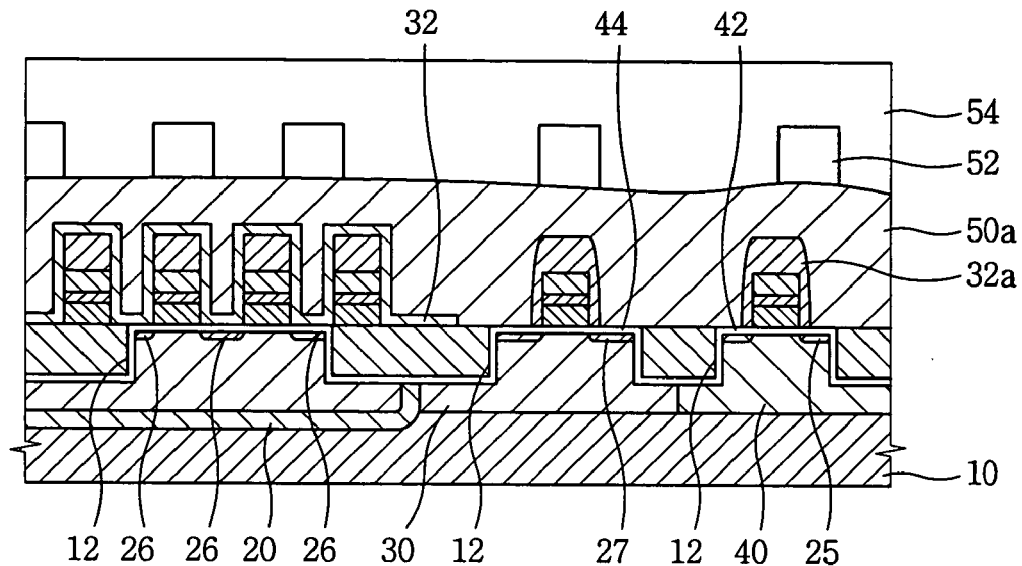

Referring to FIG. 3J, a metal layer with a thickness of about 5,000 Å was formed by depositing a metal such as aluminum, tungsten, etc., on the second silicon oxide layer 50a by utilizing a common sputtering method. Metal patterns 52 having widths of about 6,600 Å, and gaps of about 8,400 Å were formed by patterning the metal layer utilizing a photolithography process. Next, a third SOG layer 54 having a thickness range of about 3,800 to about 4,500 Å, and completely covering the metal patterns 52, was formed by spin coating the SOG solution. At this time, the weight average molecular weight of perhydropolysilazane in the third SOG layer 54 is in the range of about 4,500-7,500.

Figure 3K:
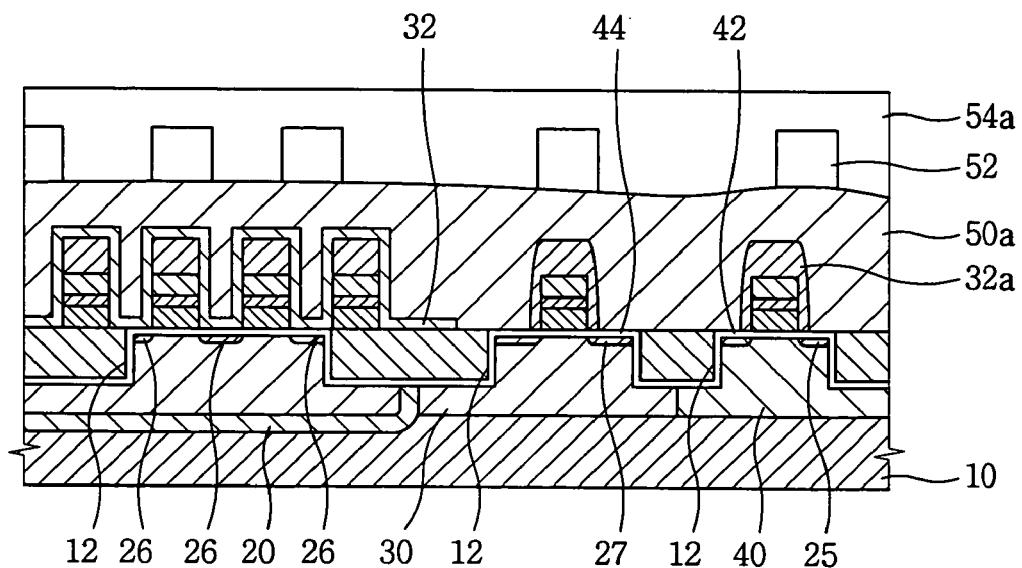

Referring to FIG. 3K, the third SOG layer 54 was pre-baked at a temperature within the range from about 100 to 500° C. for about 1-5 minutes, and then main-baked at a temperature within the range of about 400 to 450° C. for about 10-180 minutes. The main baking was conducted under a water vapor atmosphere. Then, Si—N bonds in the third SOG layer 54 were substituted with Si—O bonds through the curing process, and in accordance with an important aspect of the invention, the third SOG layer 54 was converted into a third silicon oxide layer 54a having a substantially planar surface.

A semiconductor device was manufactured by implementing a conventional semiconductor manufacturing process. Skilled artisans are capable of manufacturing a semiconductor device using the SOG composition and method of the various embodiments of the invention.

Light Absorbance of a Silicon Oxide Layer

An oxide layer was formed on a semiconductor substrate by the method described above with reference to FIGS. 3A-3K. The oxide layer was formed on a semiconductor substrate having a plurality of wiring layers having an aspect ratio within the range of about 5:1 to 10:1, and a gap between them within the range of about 0.04 to 1 μm. A silicon nitride layer having a thickness of about 400 Å was formed to cover the plurality of wiring layers and the semiconductor substrate.

A second SOG layer having a thickness of about 7,582 Å was formed by spin coating an SOG solution including polysilazane onto the semiconductor substrate. At this time, the rotational speed was controlled to about 1,000 rpm.

Figure 4:
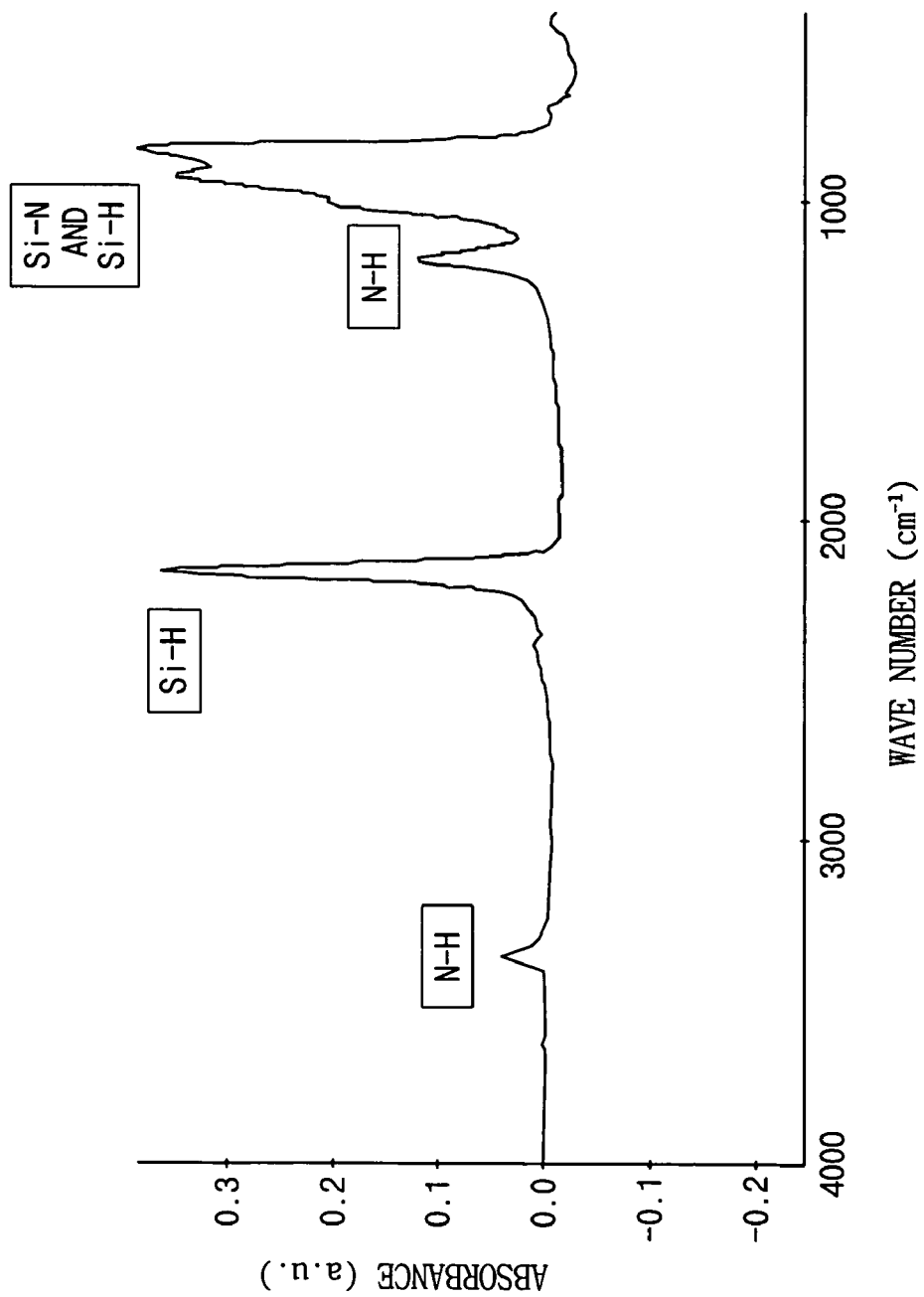
FIG. 4 is a Fourier Transform infrared spectroscopy (FT-IR) diagram showing the light absorbance of a layer detected after pre-baking an SOG layer.
Figure 5:
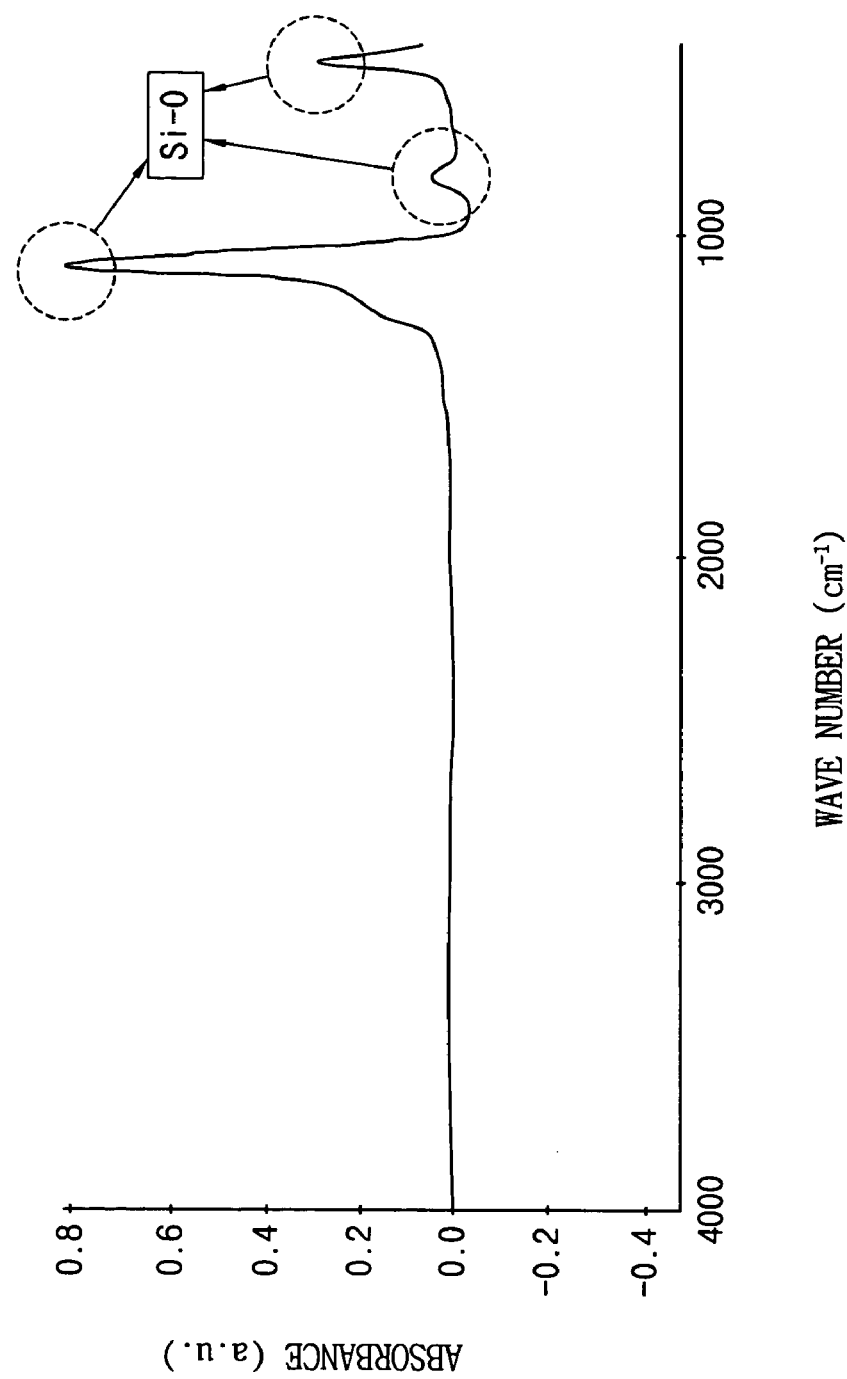
FIG. 5 is an FT-IR diagram showing the light absorbance of a silicon oxide layer detected after main baking an SOG layer.

The second SOG layer was pre-baked at 150° C. for 3 minutes. After the pre-baking, the light absorbance of the SOG layer was detected by utilizing an FT-IR method. Skilled artisans are capable of using the FT-IR method to determine the light absorbance of the SOG layer. FIG. 4 is an FT-IR diagram showing the light absorbance of a layer obtained after pre-baking the SOG layer. As shown in FIG. 4, light absorbing peaks are illustrated at some wavelength regions that represent bonds of N—H, Si—H, Si—N, Si—H, etc. after the pre-baking. At this time, the stress value was about $3.63 \times 10^8$ (dyne/cm$^2$), and was detected with a stress gauge After the pre-baking, the SOG layer was baked again (main baking) at 700° C. for 30 minutes to convert the SOG layer into a silicon oxide layer. FIG. 5 is an FT-IR diagram illustrating the light absorbance of the silicon oxide layer detected after the main baking. As shown in FIG. 5, the peaks of wavelength regions corresponding only to Si—O bonds remain after main baking. At this time, the stress value was $-1.22 \times 10_8$ (dyne/cm$^2$). From FIG. 5, it follows that all of the Si—N bonds in the SOG layer were converted into Si—O bonds. Accordingly, the SOG layer was completely converted into a silicon oxide layer.

In addition, no voids were observed in the silicon oxide layer formed on the semiconductor substrate having a plurality of wiring patterns. The plurality of wiring patterns had an aspect ratio within the range of about 5:1 to 10:1, and a gap within the range of about 0.04 to 1 μm.

Detecting an Etching Rate of Silicon Oxide

A. Forming a Silicon Oxide Layer Utilizing SOG

An SOG solution was coated onto a bare wafer to form an SOG layer. The SOG solution was coated by a spin coating method whereby the rotational velocity of the wafer was about 1,000 rpm. The SOG layer was deposited to a thickness of about 7,500 to about 8,200 Å. Next, the SOG layer was pre-baked at about 150° C. for 3 minutes, and then main-baked at about 700° C. for 30 minutes. The main baking was conducted under a water vapor atmosphere whereby the content of water vapor in this atmosphere was in the range of about 1.2-86% by weight. Si—N bonds in the SOG layer were substituted with Si—O bonds during the curing process and the SOG layer was converted to a silicon oxide layer. The thickness of the thus formed silicon oxide layer was about 6,400 Å.

B. Forming an Oxide Layer by a CVD Method

A high density plasma (HDP) CVD-oxide layer was formed on a bare wafer by utilizing silane gas and oxygen as a source gas, and argon gas as a carrier gas. The thickness of thus formed CVD-oxide layer was about 6,000 Å.

C. Detecting the Wet Etching Rate

The silicon oxide layer formed by the method of the present invention and the CVD-oxide layer formed by the CVD method were respectively etched. The respective wet etching processes were conducted by using the same etching solution for a constant period of time, and etching rate was detected with a constant time interval. The results are illustrated in FIGS. 6A-6F.

Figure 6A:
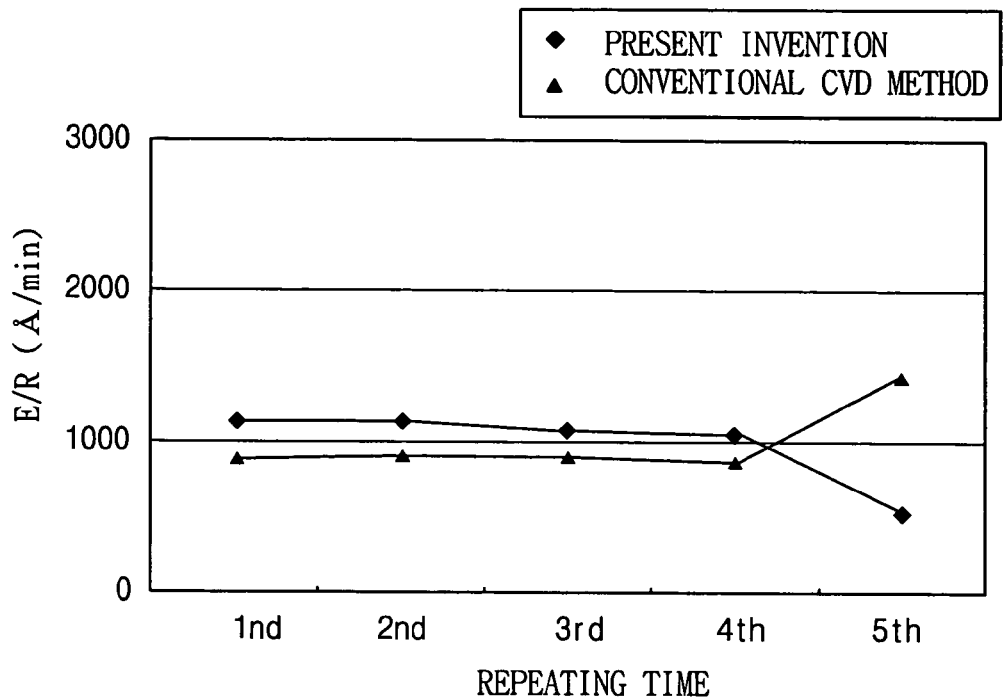
FIGS. 6A-6G are graphs illustrating etching ratios of silicon oxide layers according to another embodiments of the present invention, and the etching ratios of silicon oxide layers formed by a conventional CVD method.

FIG. 6A represents curves illustrating the etching rates detected at a time interval of 1 minute for the oxide layer formed by a method of the present invention and the oxide layer formed by the CVD method. Wet etching was carried out in a solution obtained by diluting a buffer etching solution including ammonium fluoride into distilled water (NH$_4$F and HF diluted in distilled water) at room temperature (25° C.).

Figure 6B:
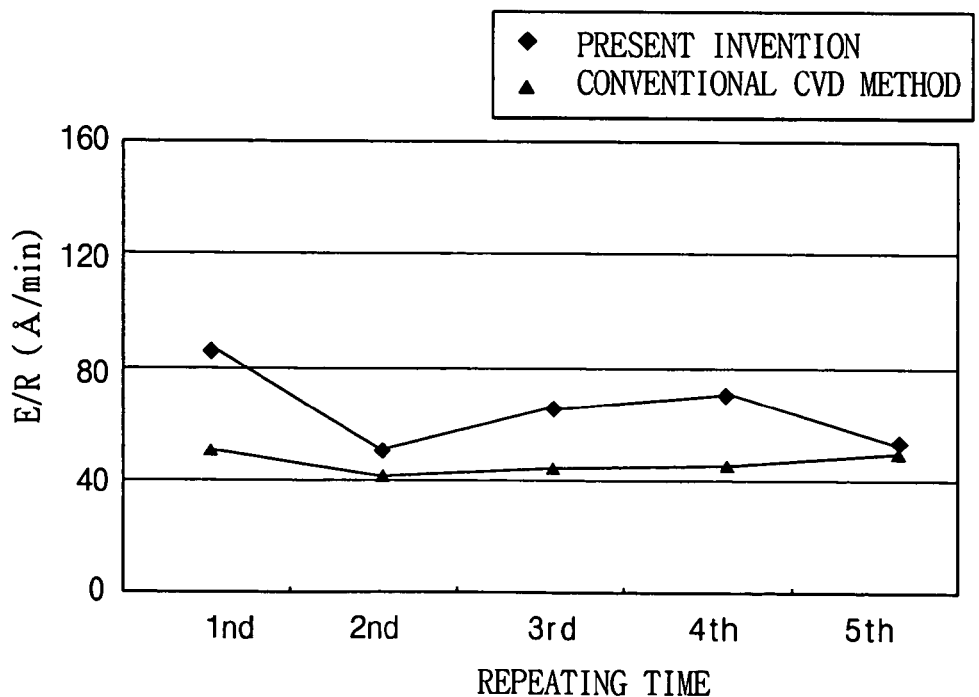

FIG. 6B represents curves illustrating the etching rates detected at a time interval of 1 minute for the oxide layer formed by a method of the present invention and the oxide layer formed by the CVD method. Wet etching was carried out in an aqueous solution of diluted hydrofluoric acid (DI:HF=100:1) at room temperature (25° C.).

Figure 6C:
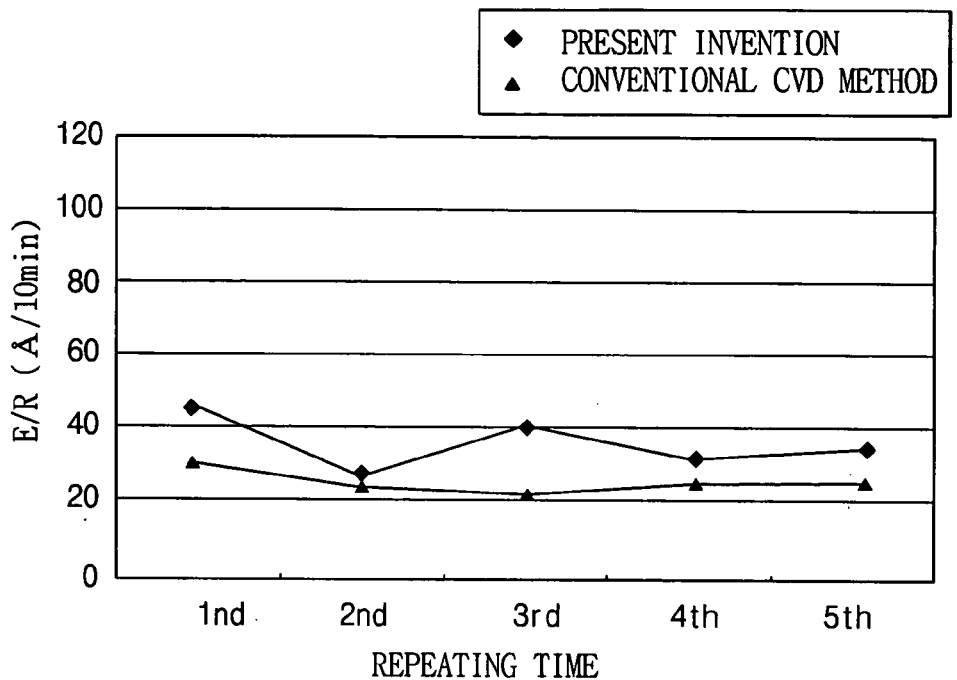

FIG. 6C represents curves illustrating the etching rates detected at a time interval of ten minutes for the oxide layer formed by a method of the present invention and the oxide layer formed by the CVD method. Wet etching was carried out in a mixed etching solution of NH$_4$OH:H$_2$O$_2$:H$_2$O in a ratio of 0.25:1:5 at 70° C.

Figure 6D:
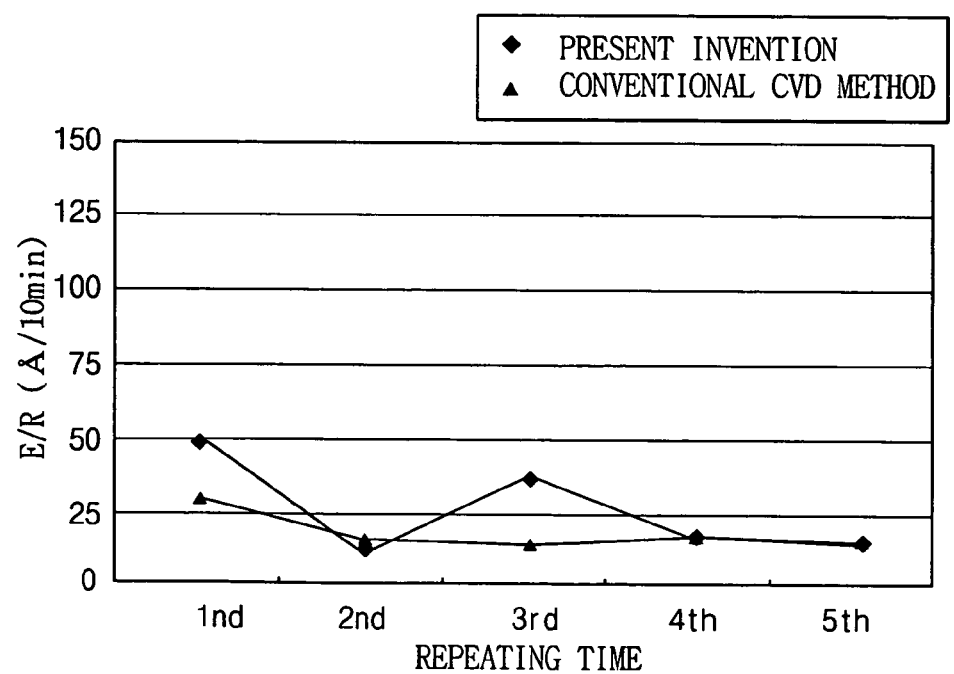

FIG. 6D represents curves illustrating the etching rates detected at a time interval of ten minutes for the oxide layer formed by a method of the present invention and the oxide layer formed by the CVD method. Wet etching was carried out in phosphoric acid at 165° C.

Figure 6E:
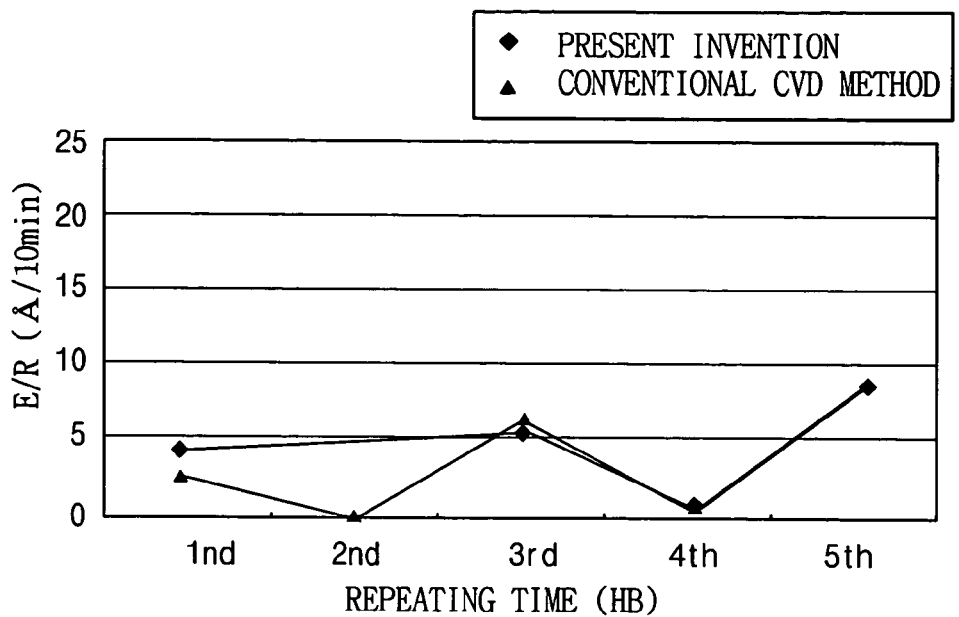

FIG. 6E represents curves illustrating the etching rates detected at a time interval of ten minutes for the oxide layer formed by a method of the present invention and the oxide layer formed by the CVD method. Wet etching was carried out in a mixed etching solution of H$_2$SO$_4$:H$_2$O$_2$ in a ratio of 6:1 at 130° C.

Figure 6F:
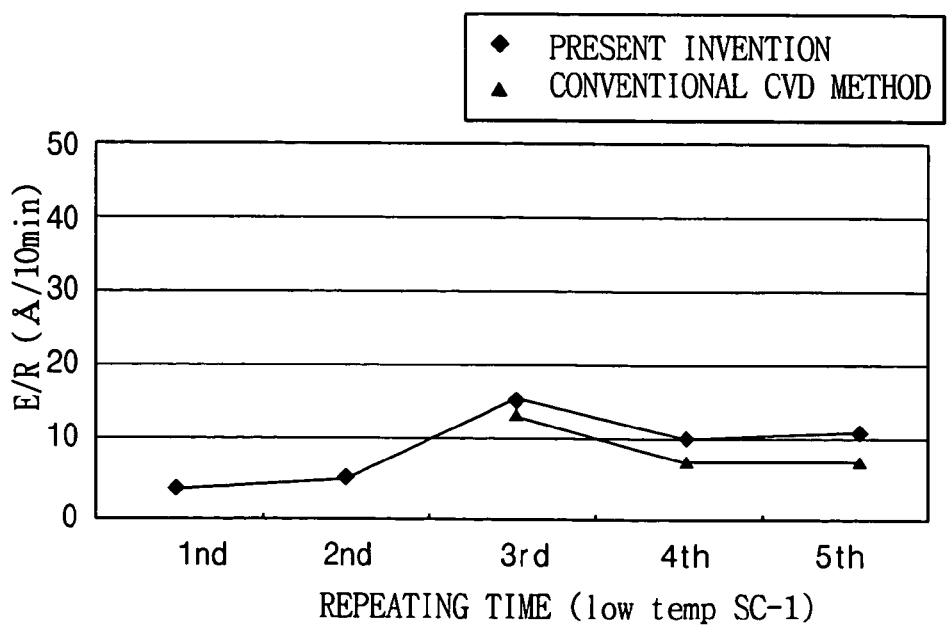

FIG. 6F represents curves illustrating the etching rates detected at a time interval of ten minutes for the oxide layer formed by a method of the present invention and the oxide layer formed by the CVD method. Wet etching was carried out in a mixed etching solution of NH$_4$OH:H$_2$O$_2$:H$_2$O in a ratio of 0.25:1:5 at 50° C.

D. Detecting the Dry Etching Rate.

Figure 6G:
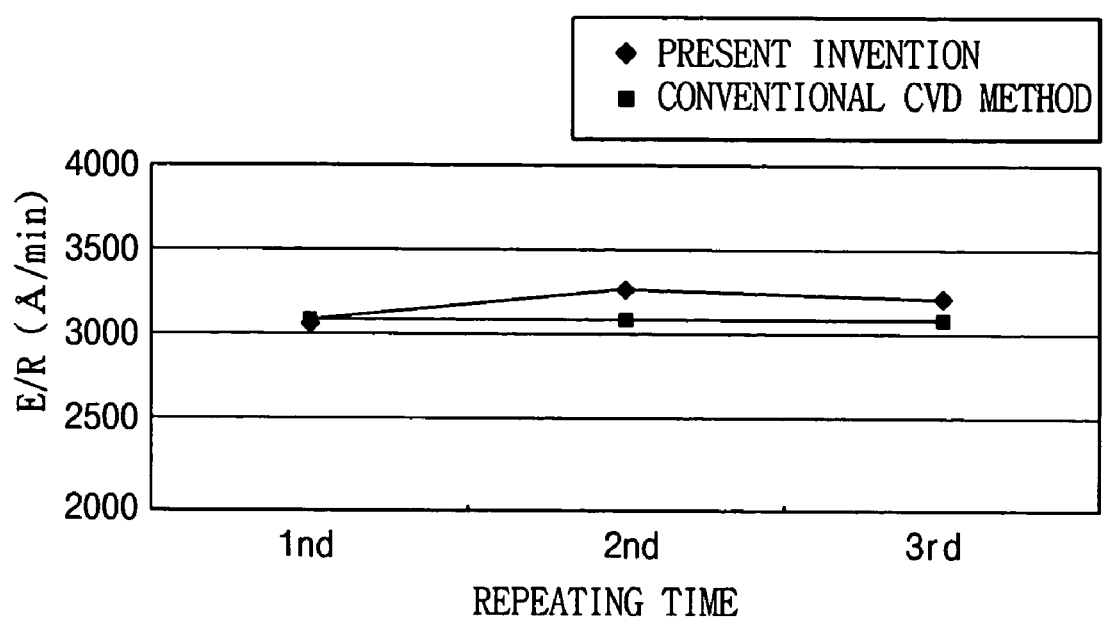

The oxide layer formed by the method of the present invention and the oxide layer formed by the CVD method were introduced into the same chamber and the etching rates were repeatedly detected by utilizing the same etching gas. The pressure in the chamber was controlled to 30 mTorr and the output power in the chamber was 1,700W. The etching gas utilized was $C_5F_8$:$C_4F_8$:$O_2$:Ar in flowing rates of 8 sccm, 4 sccm, 6 sccm and 500 sccm, respectively. The detected etching rates are illustrated as graphs in FIG. 6G.

From FIGS. 6A-6G, it can be noted that the wet and dry etching rates of the silicon oxide layer formed by the present invention were quite similar to the wet and dry etching rates of the silicon oxide layer formed by the conventional CVD method. Accordingly, a planarized layer or an inter insulation layer formed by utilizing the SOG layer according to the present invention has properties similar to the conventional CVD-oxide layer.

Through repeated experiments by the present inventors, a silicon oxide layer free from voids can be formed on a semiconductor substrate having wiring layers that have an aspect ratio within the range of about 5:1 to 10:1, and a gap within the range of about 0.04 to 1 μm. Such a silicon oxide layer can be formed by utilizing the SOG composition of the present invention. According to the present invention, a silicon oxide layer free from voids with a planarity required for 256 MDRAM can be formed by utilizing SOG.

EXAMPLE 2

Preparation of an SOG Composition

Figure 7A:
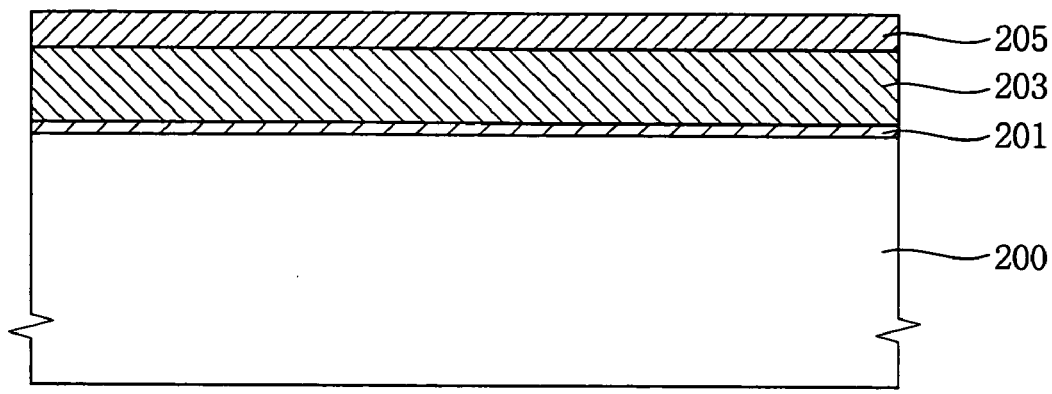
FIGS. 7A-7G are cross-sectional views for illustrating an isolating method of a shallow trench device according to further another embodiments of the present invention.
Figure 7B:
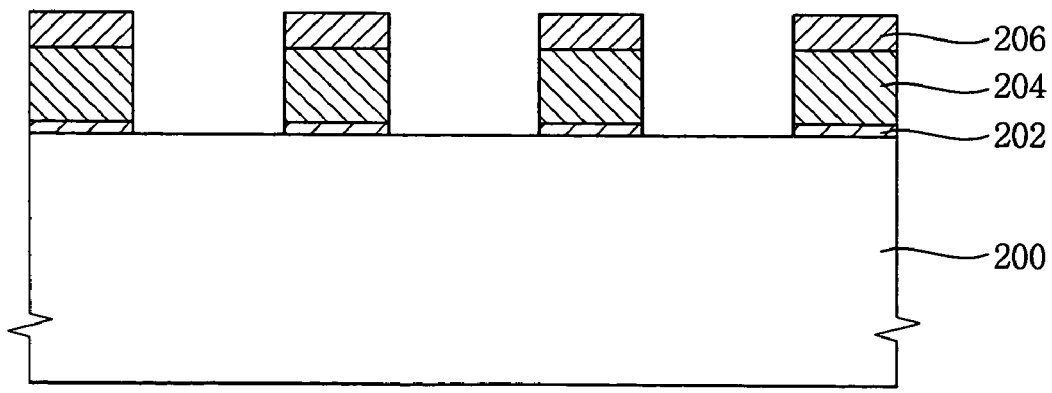
Figure 7C:
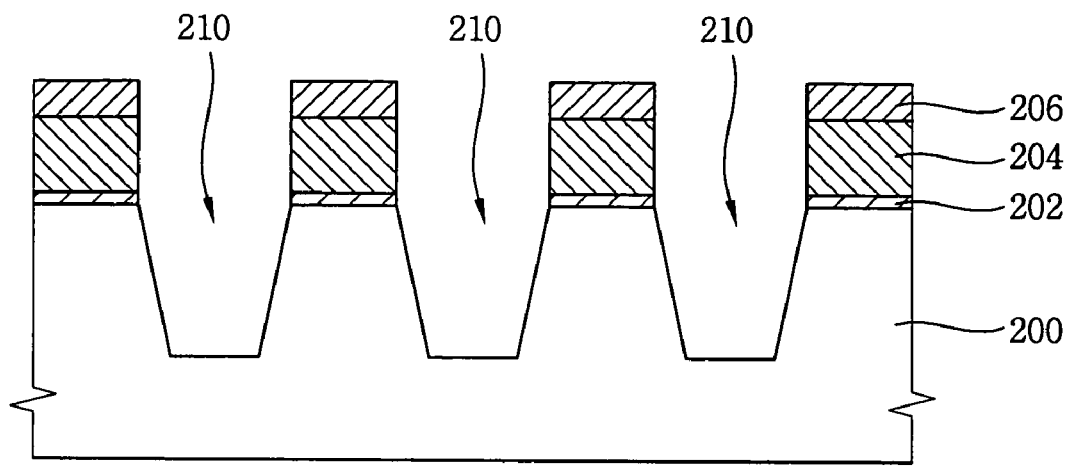
Figure 7D:
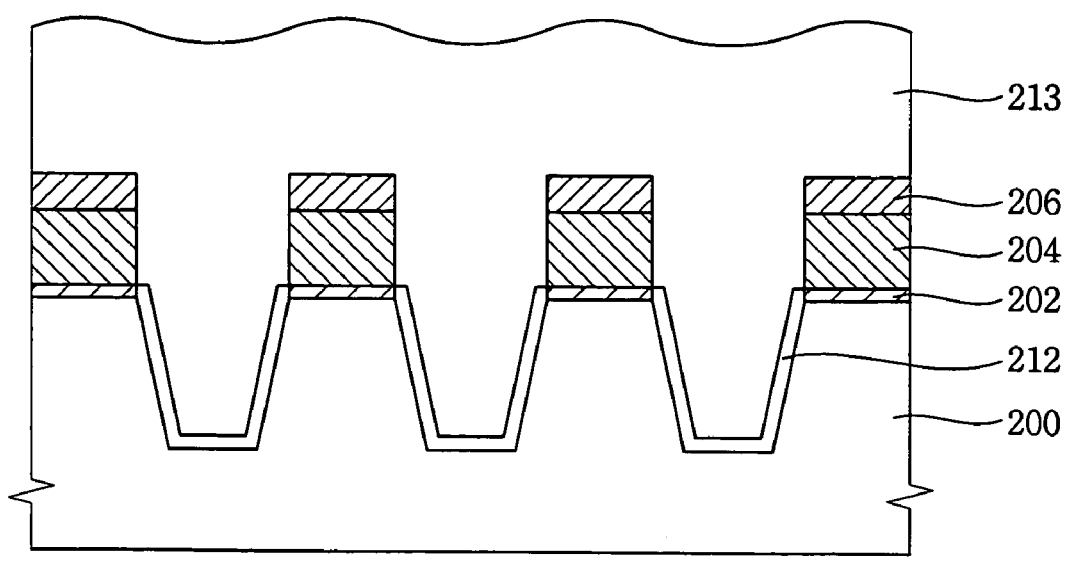
Figure 7E:
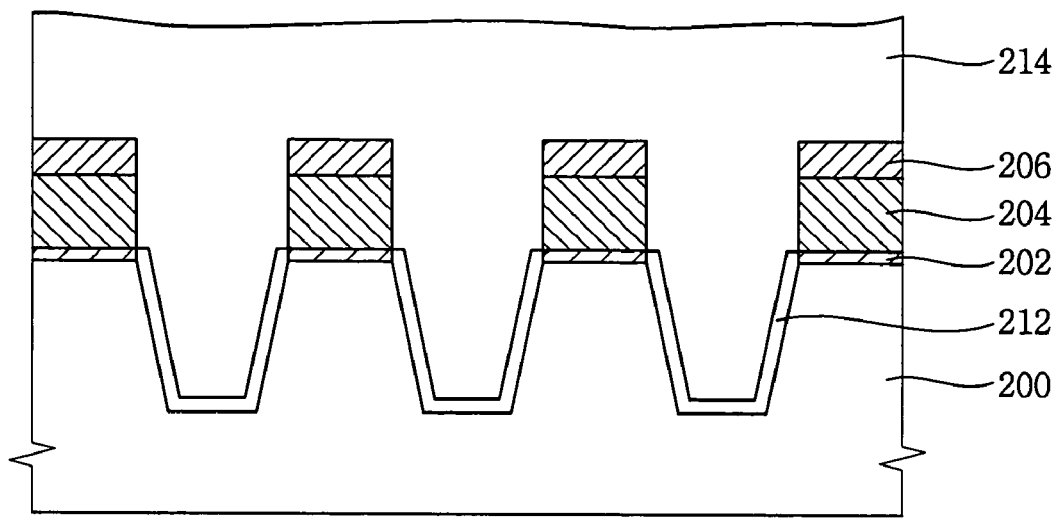
Figure 7F:
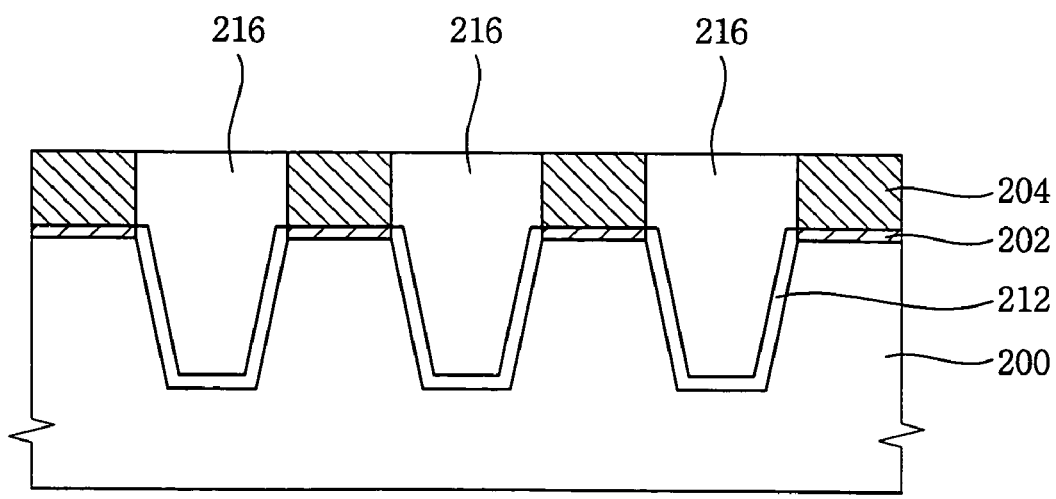

Referring to FIG. 7F, thus formed silicon oxide layer 214 was polished by a CMP method until the polishing stopping layer 204 on the semiconductor substrate 200 was exposed. Then, the inner portion of the trench 210 was buried with silicon oxide 214. Reference numeral 216 refers to a silicon oxide layer filling the trench.

Shallow Trench Isolation

When the field oxide 14 illustrated in FIG. 3 is formed to bury the trench of the highly integrated semiconductor device according to Example 1, a thick oxide layer is formed at the inner wall of the trench as illustrated in FIG. 1.

FIGS. 7A-7G are cross-sectional views for illustrating an isolating method of a shallow trench device according to further another embodiments of the present invention.

Referring to FIG. 7A, a pad oxide layer 201 having a thickness of about 100-200 Å was formed by a thermal oxidation process on a semiconductor substrate made of silicon. Then, a nitride layer was deposited to a thickness of about 100-1000 Å by an LPCVD (low pressure chemical vapor deposition) method on the pad oxide layer 201 to form a polishing stopping layer 203. The polishing stopping layer 203 was provided for stopping polishing during a subsequent CMP process.

Next, a high temperature oxide (HTO) layer was deposited by an LPCVD method to a thickness of about 500-1000 Å on the polishing stopping layer 203 to form a hard mask layer 205. Silicon oxynitride (SiON) was deposited on the hard mask layer 205 to a thickness of about 200-800 Å by an LPCVD method to form an anti-reflective layer (not shown). The anti-reflective layer functioned to prevent a diffused reflection during implementing a photolithography and was removed during the subsequent process of a trench formation.

Referring to FIG. 7B, a hard mask pattern 206 for forming an active pattern was formed by dry etching the anti-reflective layer and the hard mask layer 205 by the photolithography. Then, the polishing stopping layer 203 and the pad oxide layer 201 were etched by using the hard mask pattern 206 as an etching mask to form a polishing stopping layer pattern 204 and a pad oxide layer pattern 202.

Referring to FIG. 7C, a trench 210 was formed by etching an exposed substrate 200 to a depth of about 2000-5000 Å by using the hard mask pattern 206. Preferably, the depth of the trench 210 was 4600 Å and the width thereof was 1250 Å. At this time, the anti-reflective layer was removed and the hard mask pattern 206 was etched to a predetermined thickness.

Referring to FIG. 7D, the exposed portion of the trench 210 was heat treated under an oxidizing atmosphere in order to cure a silicon damage induced onto the semiconductor substrate 200 by an ion impaction of high energy during the trench etching process. Then, a trench inner wall oxide layer 212 was formed at the inner wall of the trench 210 including the bottom and side portions of the trench 210 to a thickness of about 20-300 Å by an oxidation reaction between the exposed silicon with an oxidizing agent.

After that, an SOG layer 213 was formed to a thickness of about 6000-7000 Å by filling the SOG composition into the trench 210.

Referring to FIG. 7E, a pre-baking onto the SOG layer 213 was implemented at a temperature range of about 100-500° C. for about 1-5 minutes.

Then, a heat treatment was implemented under an oxidizing atmosphere at a temperature range of about 800-900° C., preferably at about 850° C., for about 10-120 minutes, preferably for about 60 minutes to convert the SOG layer 213 into silicon oxide. At this time, the atmosphere was a humidity atmosphere of which humidity was about 86% by weight.

After that, a second heat treatment was implemented to densify the converted silicon oxide and convert into a silicon oxide layer 214. The second heat treatment was implemented under an oxidizing atmosphere, an inert gas atmosphere, or a mixed atmosphere thereof. Preferably, the second heat treatment was implemented under an inert gas atmosphere such as a nitrogen gas atmosphere. Preferably, the second heat treatment was implemented at a temperature range of about 900-1100° C. for about 10-120 minutes, and more preferably, at a temperature of about 1000° C. for about 30 minutes.

Referring to FIG. 7F, thus formed silicon oxide layer 214 was polished by a CMP method until the polishing stopping layer 204 on the semiconductor substrate 200 was exposed. Then, the inner portion of the trench 210 was buried with silicon oxide 214.

Figure 7G:
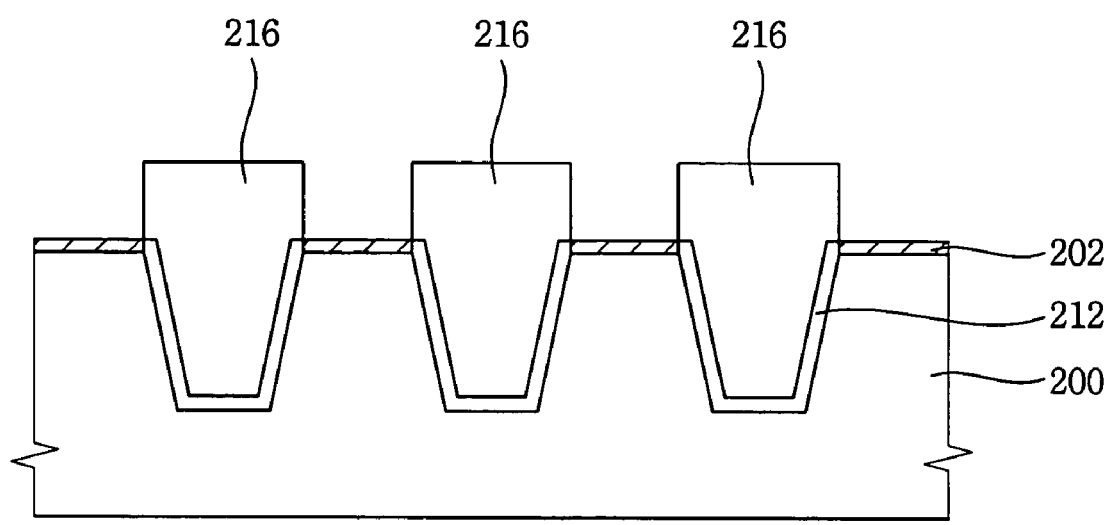

Referring to FIG. 7G, the polishing stopping layer pattern 204 was removed by a strip process using phosphoric acid to complete the isolation, as illustrated in FIG. 7G.

Detecting of a Formation of Substrate Oxide

Experiment 1

An SOG layer was formed on a blanket wafer and the pre-baking and the main-baking were implemented, in the same manner as in Example 1.

Experiment 2

An SOG layer was formed on a blanket wafer and the pre-baking, the first heat treatment at 850° C. for 1 hour under a humidity atmosphere and the second heat treatment at 1000° C. for 30 minutes under an oxygen gas atmosphere were implemented to obtain a silicon oxide layer, in the same manner as in Example 2.

Experiment 3

A silicon oxide layer was formed by implementing the same method as in Experiment 2, except that the second heat treatment was implemented under a nitrogen gas atmosphere.

Experiment 4

A silicon oxide layer was formed by implementing the same method as in Experiment 2, except that the second heat treatment was implemented at 1050° C.

Experiment 5

A silicon oxide layer was formed by implementing the same method as in Experiment 2, except that the first heat treatment was implemented at 900° C.

Detecting an Oxidizing State at the Substrate Surface

Figure 8:
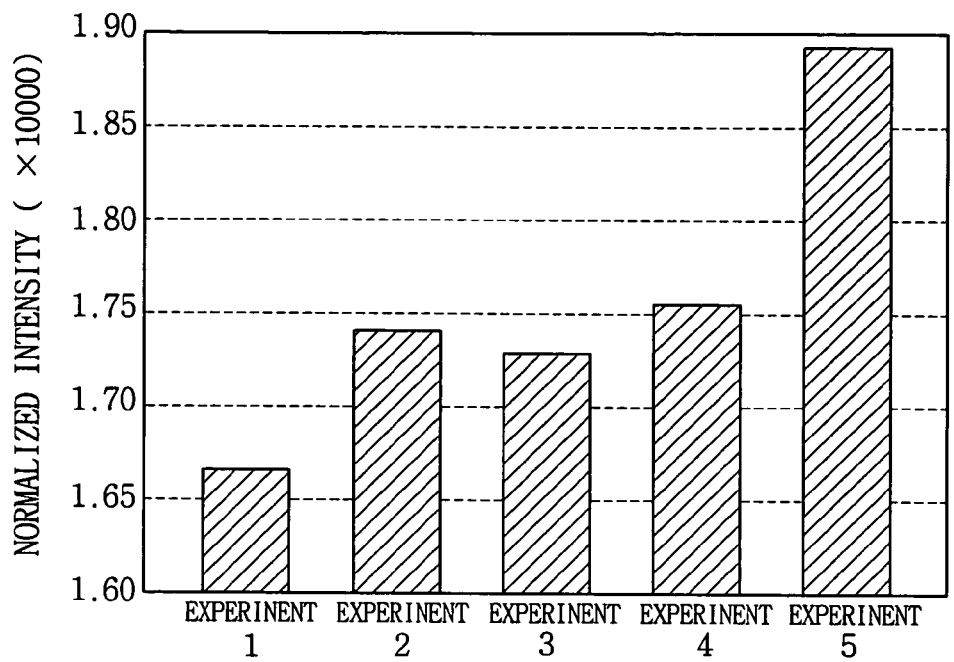
FIG. 8 is a bar graph illustrating normalized intensities of the light absorbance obtained by an FT-IR for silicon oxide at an active region of a substrate, when a silicon oxide layer is formed according to the present invention.

FT-IR analyses were conducted with respect to a stretching peak of an Si—O bond on the surface of the substrate for the wafers onto which the baking processes were conducted according to Experiments 1-5. FIG. 8 is a bar graph illustrating normalized intensities of the light absorbance obtained by an FT-IR for silicon oxide at an active region of a substrate, when a silicon oxide layer is formed according to the present invention. As known from FIG. 8, the silicon oxide layers obtained by implementing two-step heat treatment as illustrated in Experiments 2-5 includes somewhat larger amounts of oxides when comparing with the silicon oxide layer obtained by implementing one-step heat treatment as illustrated in Experiment 1. Among the produced oxides from the substrate by Experiments 2-5, the amount of the oxide from Experiment 3 was the smallest.

Detecting Wet Etching Rate and Etching Uniformity

Figure 9:
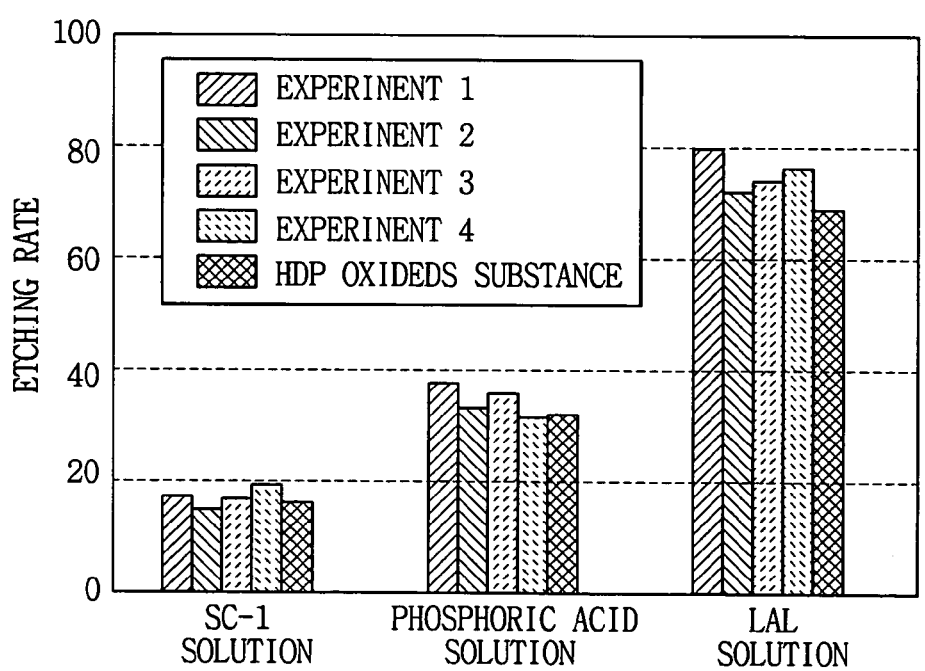
FIG. 9 is a graph illustrating etching rates of a silicon oxide layer manufactured by the method of the present invention according to the kind of etching solutions.

Etching rates of a silicon oxide layers formed by converting the SOG manufactured by Experiments 2-4 and a silicon oxide layer manufactured by a high density plasma were detected according to the kind of etching solutions. Wet etching was implemented for a constant time period using the same etching solution and the etching rate was detected with a constant time interval. As for the etching solution, SC-1 solution (a mixture of ammonia, hydrogen peroxide and deionized water), LAL solution (a mixture of ammonium fluoride and hydrogen fluoride) and phosphoric acid were applied. The result is illustrated in FIG. 9 as a graph. In FIG. 9, the axis of ordinate represents the etching rate, and the axis of abscissa represents the etching solutions and the kind of the etched oxides.

From FIG. 9, it is confirmed that the silicon oxide layers manufactured from Experiments 2-5 give similar etching rates with that manufactured from Experiment 1.

Polishing Test

Figure 10:
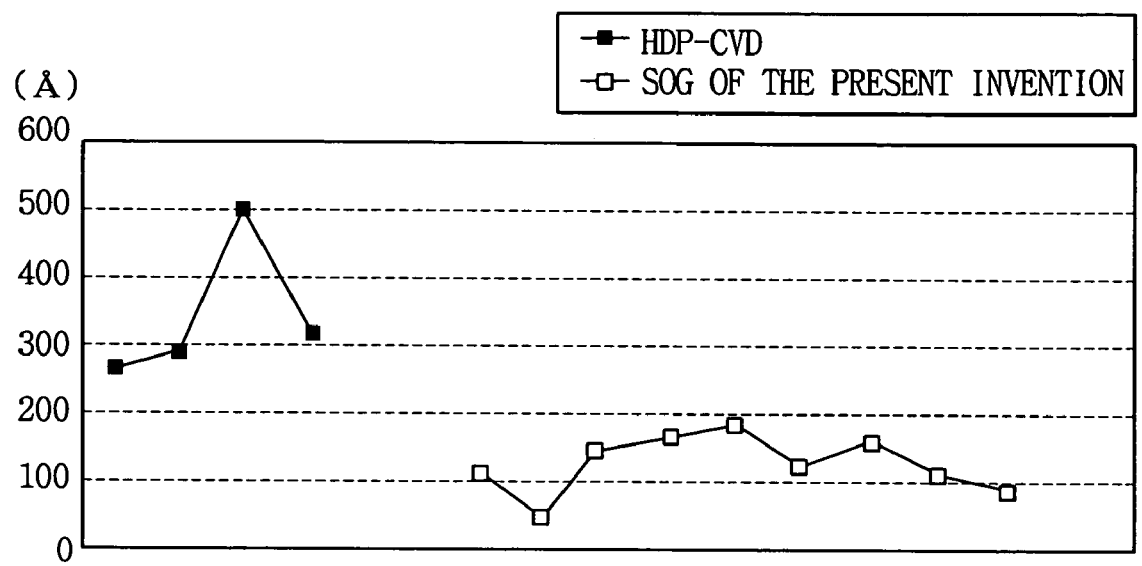
FIG. 10 is a graph illustrating the uniformity of polishing obtained by examining the profile of an oxide layer after implementing a chemical mechanical polishing onto a silicon oxide layer manufactured by Example 2 and a silicon oxide layer manufactured by a high density plasma method.

A chemical mechanical polishing was implemented after burying a trench in the semiconductor substrate having the same patterns described in Example 2 by utilizing the silicon oxide layer manufactured by Example 2 (the baking process was implemented as described in Experiment 3) and the silicone oxide layer manufactured by using the high density plasma method. The polishing was implemented until the polishing stopping layer was exposed and the profile of the oxide layer was examined to inspect the polishing uniformity. The result is illustrated in FIG. 10. In FIG. 10, the graph designated by ■ corresponds to the result obtained after polishing the silicon oxide layer manufactured by the high density plasma method, while the graph designated by □ corresponds to the result obtained after polishing the silicon oxide layer manufactured by Experiment 3. During the polishing, the same silica was used for the manufacture of a slurry. In FIG. 10, the axis of the ordinates represents a polishing degree after completing the polishing (unit: Å). The polishing time was about 180-200 seconds for the silicon oxide layer manufactured by the high density plasma method, while being about 100 seconds for the silicon oxide layer manufactured by Experiment 3. From FIG. 10, the polishing amount of the silicon oxide layer manufactured by the high density plasma method was about 300-500 Å, while that manufactured by Experiment 3 was about 100-200 Å.

It is known from FIG. 10 that the polishing uniformity of the silicon oxide layer manufactured by Example 2 is about two times better than that manufactured by the conventional high density plasma method, and the polishing time of the former is about half of that of the latter.

In addition, the silicon oxide layer manufactured by Example 2 has no voids and gives a good gap filling characteristic. However, the oxide layer manufactured by the high density plasma method has lots of voids on the trench portion. Further, silicon of the active region was not oxidized and the oxide layer is densified to the bottom portion of the trench, thereby giving a good oxide layer characteristic.

Figure 11:
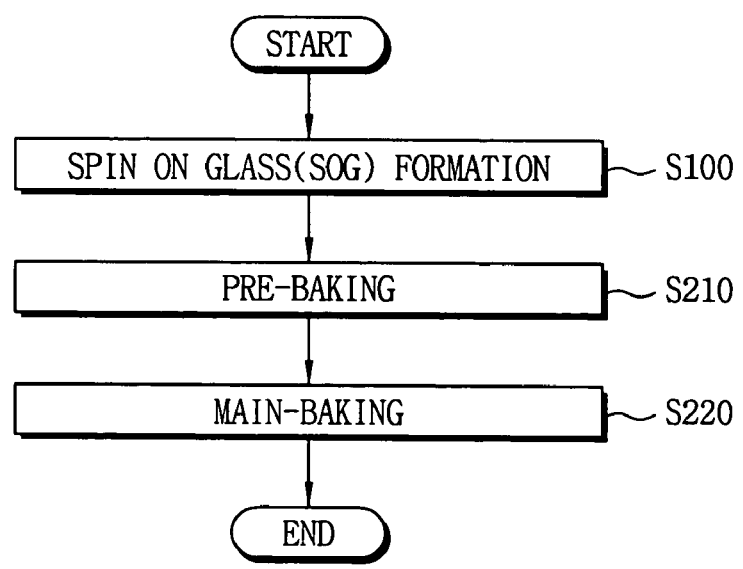
FIG. 11 is a flowchart illustrating a method of forming an oxide layer using an SOG composition according to an embodiment of the present invention.

FIG. 11 is a flowchart illustrating a method of forming an oxide layer using an SOG composition according to an embodiment of the present invention. Referring to FIG. 1, after forming an SOG layer by coating the SOG composition on a substrate in step S100, an oxide layer may be formed by hardening the SOG layer in steps S210 and S220.

In step S100, an SOG composition may be coated on a semiconductor substrate having a stepped portion thereon, thereby forming the SOG layer having a level surface on the substrate. The stepped portion may be formed by at least two conductive patterns formed on the substrate. For example, the conductive pattern may include metal conductive wiring patterns such as gate electrode patterns and/or bit line patterns.

In step S210 and step S220, the SOG layer may be cured so that the SOG layer is converted to a level silicon oxide layer. The SOG layer may be cured by a pre-baking process and a main-baking process. The pre-baking process (step S210) may be performed at temperature of about 100 to about 500° C., whereas the main-baking process (step S220) may be carried out at temperature of about 400 to about 1,200° C.

When the pre-baking process (step S210) is performed at a temperature below about 100° C., organic solvent may possibly remain in the silicon oxide layer. On the other hand, when the pre-baking process is carried out at a temperature over about 500° C., the perhydropolysilazane may not be completely converted into silicon oxide in the subsequent main-baking process, and the surface portion of the SOG layer may be rapidly converted into silicon oxide, which may generate cracks, thereby causing non-uniformity in the resultant silicon oxide layer.

When the pre-baking process (step S210) is performed for less than one minute, organic solvents may remain in the layer. On the other hand, when pre-baking process is carried out for more than 5 minutes, partial conversion into silicon oxide may occur at the surface of the SOG layer including perhydropolysilazane, thereby forming partial cracks even if the organic solvent is completely removed. Therefore, the pre-baking process preferably is performed at temperature in a range of about 100 to about 500° C. for about 1 to about 5 minutes, and more preferably at a temperature in a range of 100 to 400° C. for about 2 to 3 minutes.

The pre-baking process (step S210) may be carried out in an atmosphere of oxygen, water vapor, mixture of oxygen and water vapor, nitrogen or vacuum. Preferably, the pre-baking process may be performed in a water vapor atmosphere.

The main-baking process (step S220) may preferably be conducted at a higher temperature and/or for a longer time compared to the pre-baking process (step S210). The basic backbone structure of perhydropolysilazane-based SOG includes Si—N bonds. These Si—N bonds may be substituted with (or converted into) Si—O bonds by baking in an atmosphere including oxygen and water. According to the conventional method employing spin-on glass compositions, not all of the Si—N bonds are substituted with Si—O bonds. In accordance with example methods of present invention, however, no Si—N bonds remain after coating the SOG solution including perhydropolysilazane to form the SOG layer and implementing the curing process.

The main-baking process (step S220) may preferably be performed at a temperature in a range of about 400 to about 1,200° C. When the main-baking process is carried out at a temperature below about 400° C., some Si—N bonds may remain, thereby deteriorating the characteristics of the oxide layer. On the other hand, when the main-baking process is performed at temperature above about 1,200° C., the planarity of the thus formed silicon oxide layer may be lowered or cracks may occur. Therefore, the main-baking process (step S220) may preferably be carried out at temperature in a range of about 400 to about 1,200° C., and more preferably, about 400 to about 1,000° C.

Further, the main-baking process (step S220) may preferably be performed for about 10 to about 180 minutes, more preferably about 30 to about 120 minutes. When the main-baking process (step S220) is performed for less than about 10 minutes, the SOG layer may not be sufficiently converted into the silicon oxide layer. On the other hand, when the main-baking process is carried out for above about 180 minutes, the stress in the thus formed silicon oxide layer may increase.

The main-baking process (step S220) may preferably be carried out in an oxidizing atmosphere and/or in an inert atmosphere that is appropriate for converting Si—N bonds into Si—O bonds. For example, useful environments for the main-baking process (step S220) may include an atmosphere of oxygen, an atmosphere including water vapor, an atmosphere including mixture of oxygen and water vapor, an atmosphere including nitrogen, and a vacuum atmosphere. The atmosphere including water vapor is preferred, and preferably contains about 1.2 to about 86% by weight of water.

According to the above-described method of the present invention, the silicon oxide layer may be formed to have thickness of about 1,000 to about 10,000 Å for one cycle of the method using the SOG composition. When the silicon oxide layer has such a thickness, conductive patterns such as gate electrodes or metal patterns may be sufficiently and economically covered with the silicon oxide layer. Additionally, a silicon nitride layer having a thickness of about 200 to about 600 Å may be formed as an etch stop layer on the upper and side portions of the conductive pattern before coating the SOG composition.

Figure 12:
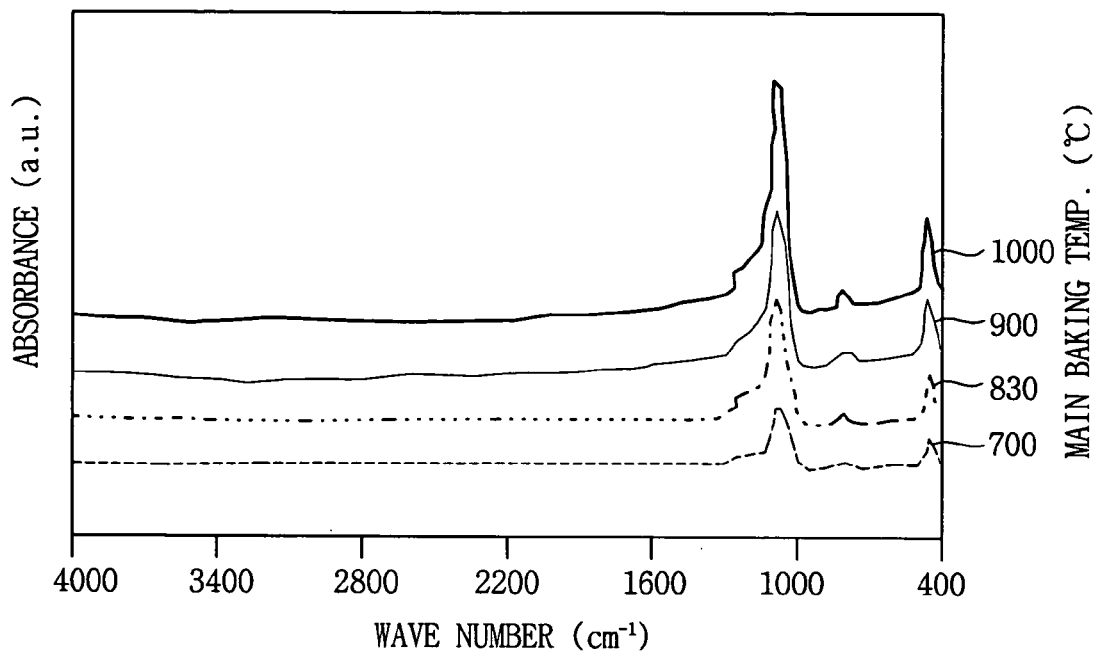
FIG. 12 is a graph illustrating FT-JR results as a function of main baking temperature (with a steam concentration of 80%) according to an embodiment of the present invention.
Figure 13:
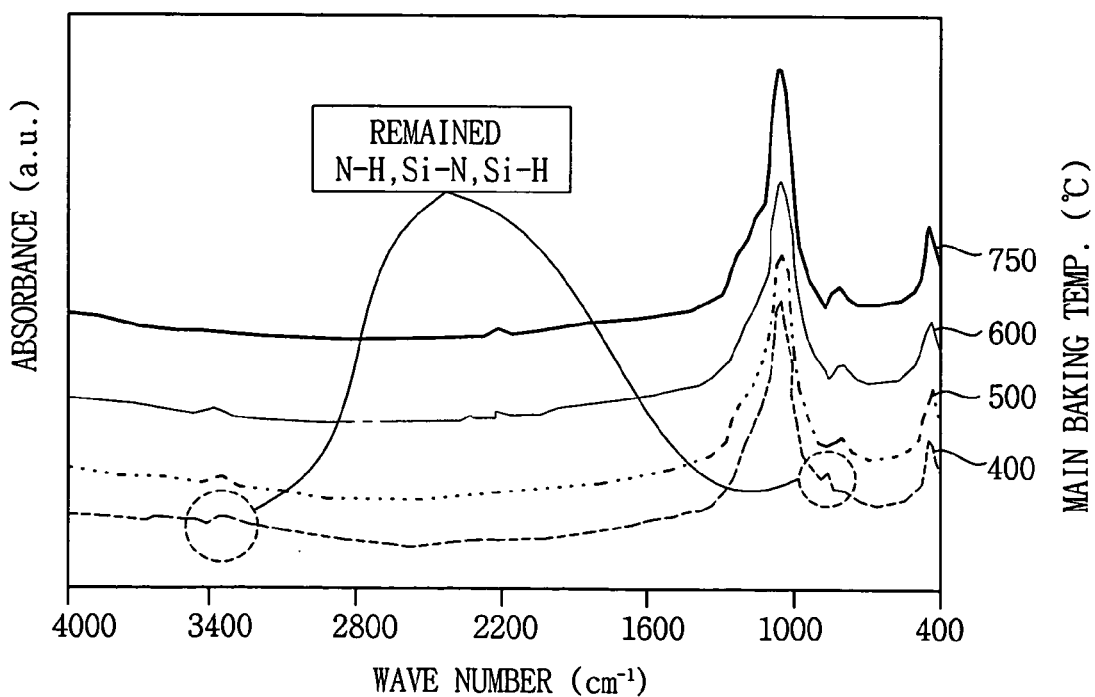
FIG. 13 is a graph illustrating FT-IR results as a function of main baking temperature (with a steam concentration of 10% or less) according to an embodiment of the present invention.

FIG. 12 is a graph illustrating FT-IR results as a function of main baking temperature (with a steam concentration of 80%) according to an embodiment of the present invention. As shown in FIG. 12, all bonds in the perhydropolysilazane are effectively converted to Si—O bonds. FIG. 13 is a graph illustrating FT-IR results as a function of main baking temperature (with a steam concentration of 10% or less) according to an embodiment of the present invention. As shown in FIG. 13, the Si—O bonds are effectively converted if main baking temperature increases when the atmosphere is wet, for example, having the steam concentration of 10% or less. The atmosphere for main baking may be oxygen and wet, where the mixed oxygen and wet atmosphere are present in an inert atmosphere such as nitrogen. Si—N, Si—H, and N—H bonds are converted into Si—O bonds in a completely wet atmosphere. The steam may be about 1.2-86 weight % in the atmosphere and more steam is needed when the main baking temperature is lowered.

Figure 14:
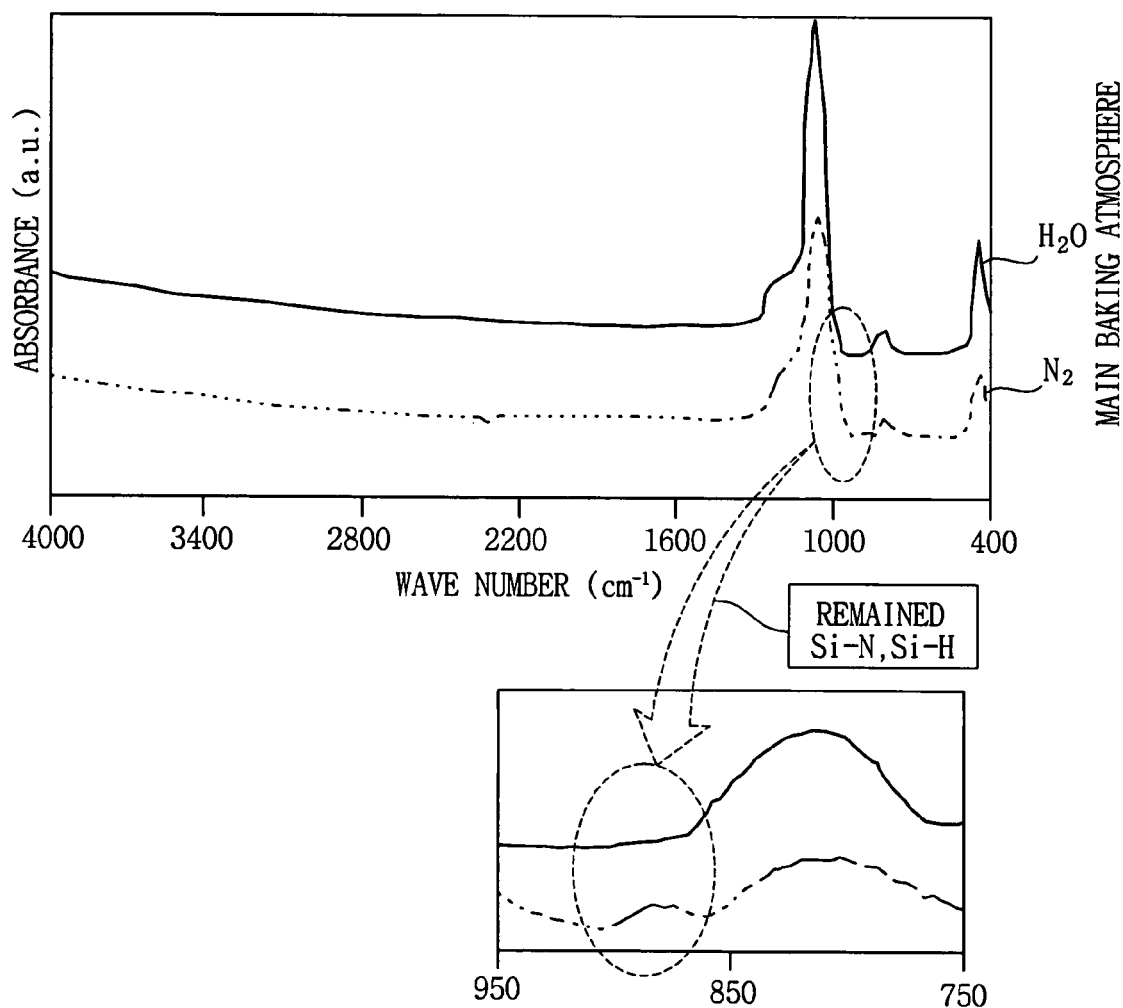
FIG. 14 is a graph illustrating FT-IR results as a function of main baking atmosphere according to an embodiment of the present invention.

FIG. 14 is a graph illustrating FT-IR results as a function of main baking atmosphere according to an embodiment of the present invention. As shown in FIG. 14, Si—O bonds may be more effectively converted in an $H_2O$ atmosphere than an $N_2$ atmosphere.

EXAMPLE 3

Preparation of an SOG Composition

Perhydropolysilazane having a weight average molecular weight of 3,000-6,000 and a molecular weight dispersion degree of 2.5-3.5 was obtained by fractionating commercially available perhydropolysilazane. The fractionated perhydropolysilazane was dissolved in xylene to obtain an SOG composition having a perhydropolysilazane concentration of 20-23% by weight, based on the total weight of the composition. The contact angle of the SOG composition was 4° or less with respect to an underlying silicon nitride layer.

The viscosity of the SOG composition was detected according to the variation of its shear rate. The SOG solution preferably has a uniform viscosity within the range of about 1.54 to 1.70 cP.

EXAMPLE 4

Preparation of an SOG Composition

Figure 15:
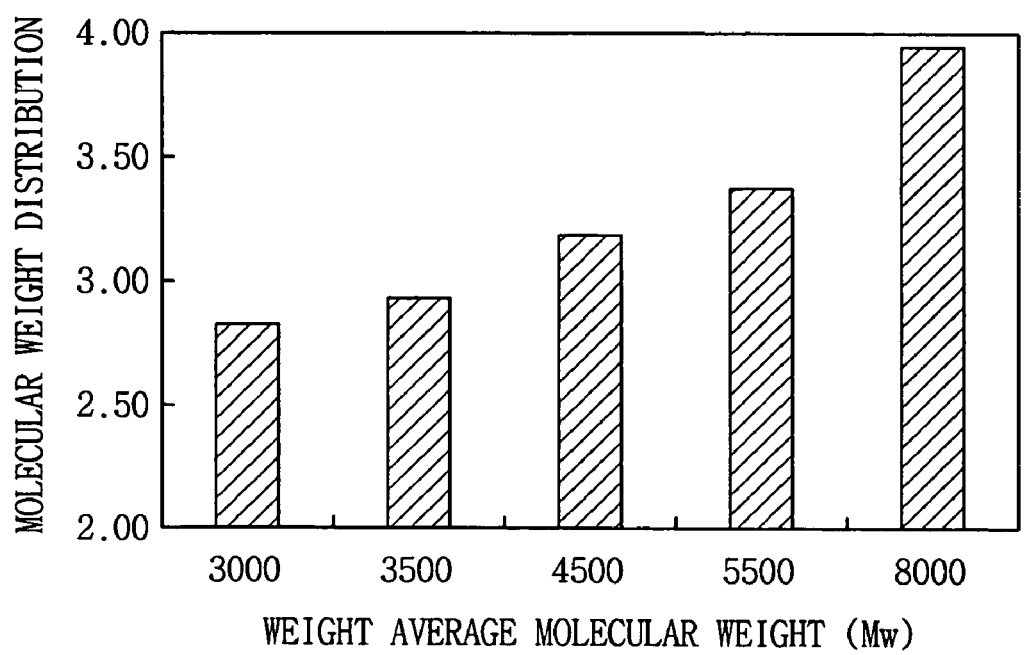
FIG. 15 is a graph illustrating molecular weight distribution as a function of weight average molecular weight (Mw) according to an embodiment of the present invention.
Figure 16:
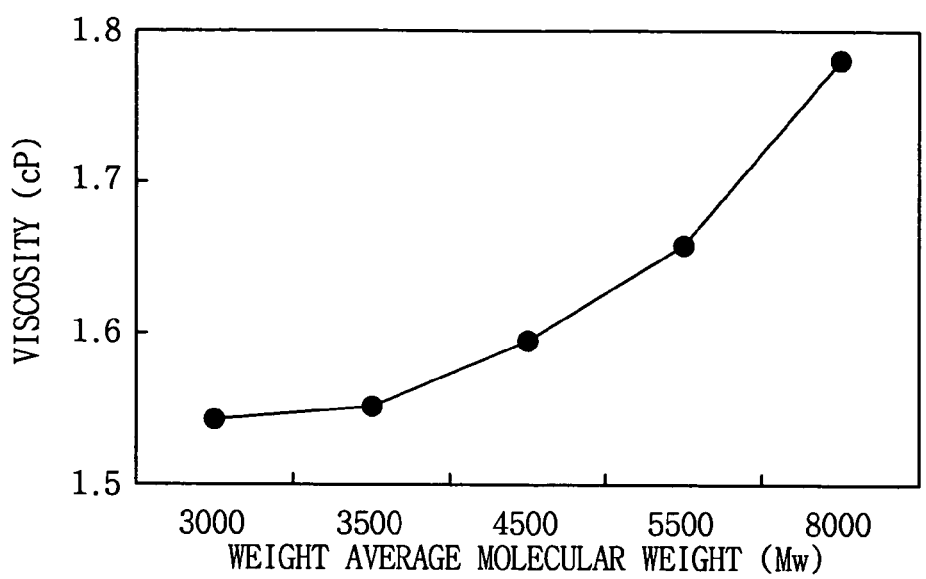
FIG. 16 is a graph illustrating viscosity as a function of weight average molecular weight (Mw) according to an embodiment of the present invention.
Figure 17:
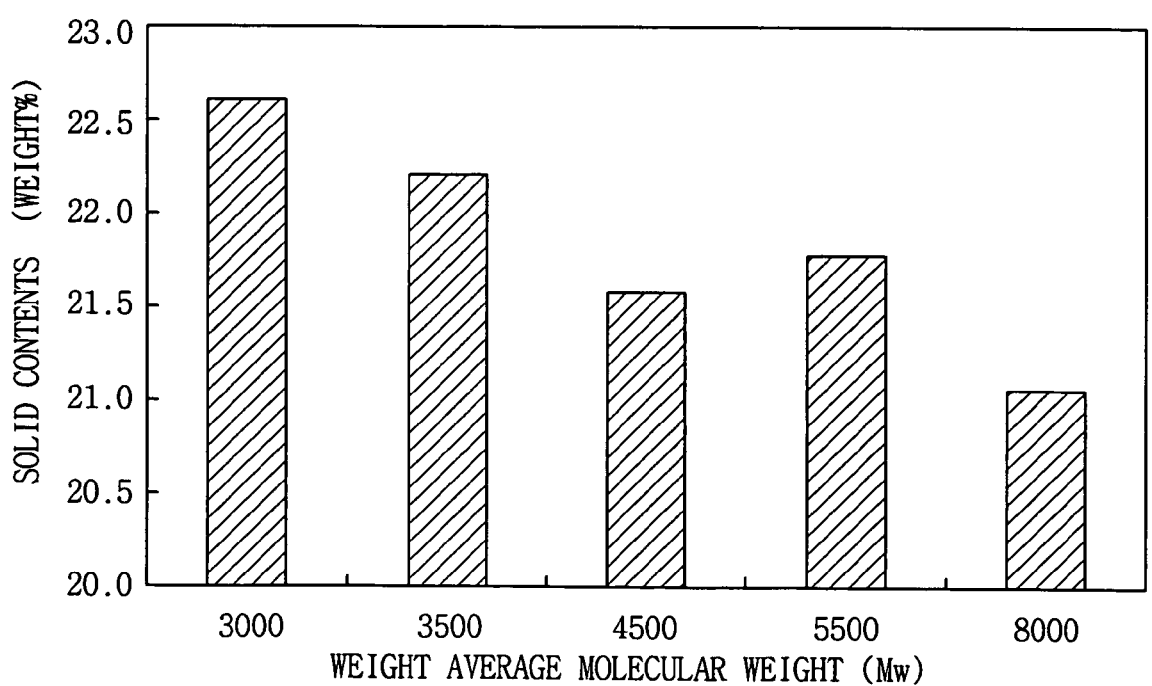
FIG. 17 is a graph illustrating solid contents (weight %) as a function of weight average molecular weight (Mw) according to an embodiment of the present invention.

The perhydropolysilazane of 3000 weight average molecular weight is obtained by fractionation method. The molecular weight distribution is 2.8. These data are arranged in Table 1 and FIG. 15. The prepared perhydropolysilazane is dissolved in DBE (di-butyl ether) to obtain the concentration of 22.6 weight percent (%). The viscosity and the concentration of solid contents in preparation of SOG composition are displayed in Table 1, FIG. 15, FIG. 16 and FIG. 17. FIG. 15 is a graph illustrating molecular weight distribution as a function of weight average molecular weight (Mw) according to an embodiment of the present invention. FIG. 16 is a graph illustrating viscosity as a function of weight average molecular weight (Mw) according to an embodiment of the present invention. FIG. 17 is a graph illustrating solid contents (weight %) as a function of weight average molecular weight (Mw) according to an embodiment of the present invention. Also, the obtained SOG composition is showing the contact angle under 4 degrees against silicon nitride as under-layer.

EXAMPLES 5-7

Preparation of an SOG Composition

The SOG composition is manufactured in same manner as in Example 4, except for changing the weight average molecular weight. The perhydropolysilazane of 3500 (Example 5), 4500 (Example 6), and 5500 (Example 7) weight average molecular weight is used in respective embodiments. The viscosity and the concentration of solid contents according to in respective embodiments are displayed in Table 1, FIG. 15, FIG. 16 and FIG. 17.

Comparative Example 1

Preparation of an SOG Composition

The SOG composition is manufactured in same manner as in Example 4, except for the perhydropolysilazane using of 8,000 weight average molecular weight. The viscosity and the concentration of solid contents according this embodiment are displayed in Table 1, FIG. 15, FIG. 16 and FIG. 17.

EXAMPLE 8

Formation of an Oxide Layer

Figure 18A:
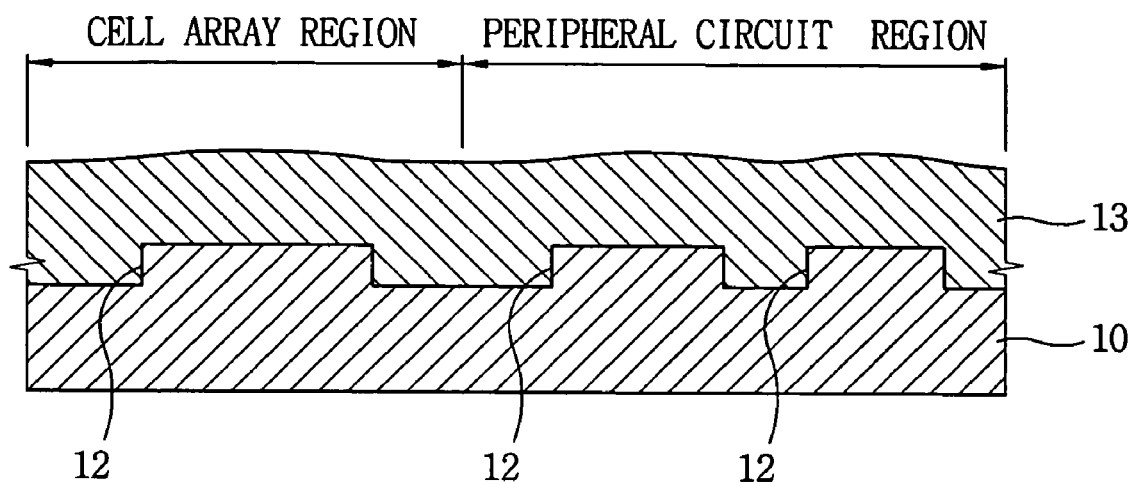
FIGS. 18A-18K are cross-sectional views illustrating a method of forming a silicon oxide layer in a semiconductor manufacturing process according to another embodiment of the invention.

FIGS. 18A-18K are cross-sectional views illustrating a method of forming a silicon oxide layer in a semiconductor manufacturing process according to another embodiment of the present invention. Referring to FIG. 18A, there is provided a p-type substrate 10 formed of a semiconductor material, such as silicon (Si). Trenches 12 were formed on the substrate 10 by etching an isolation region. The depth of trench 12 was about 4,600 Å, and the width thereof was about 1,250 Å. On the substrate 10 on which the trenches 12 were formed, the SOG solution including perhydropolysilazane of which weight average molecular weight is in the range of 3,000-6,000 (for example, 3,000) and prepared as above was coated to a thickness of about 6,000 to 7,000 Å (for example, 7,000 Å) to form a first SOG layer 13.

Figure 18B:
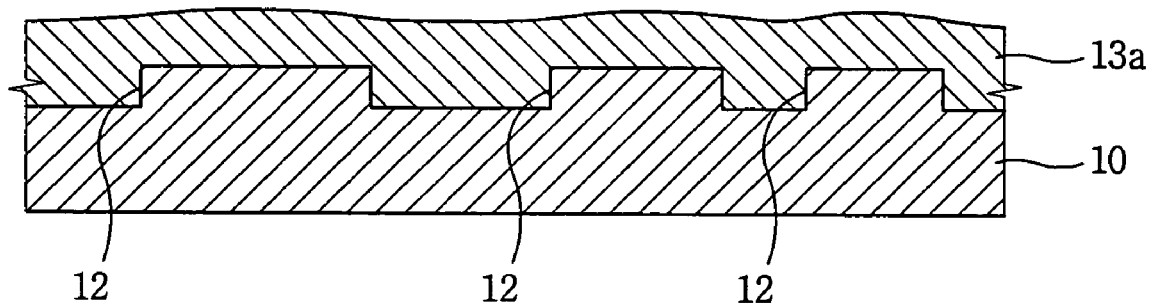
Figure 18C:
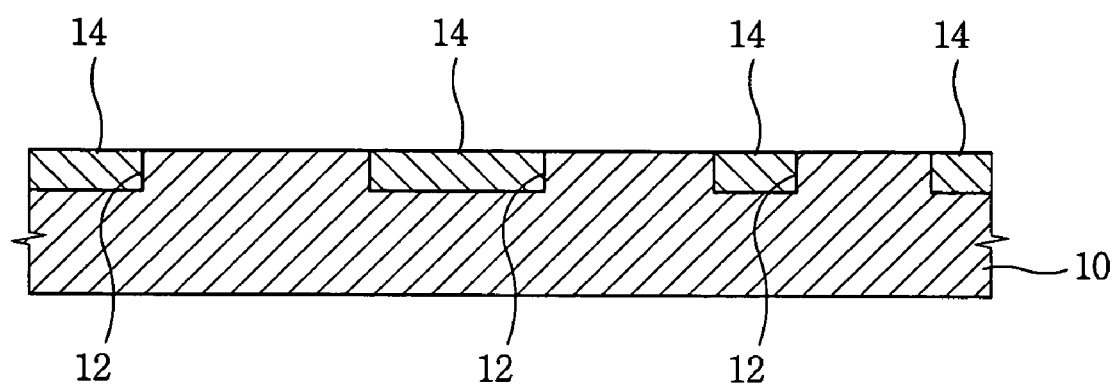

Referring now to FIG. 18B, the first SOG layer 13 was pre-baked on a hot plate at about 100 to 500° C. (for example, 300° C.) for 1-5 minutes in air, and then main-baked at about 900 to 1,000° C. (for example, 950° C.) for 30 minutes to convert the first SOG layer 13 into a first silicon oxide layer 13a. At this time, the baking was implemented under a water vapor atmosphere having a water content of about 86% by weight. Referring to FIG. 18C, the silicon oxide layer 13a was polished by a CMP method until the upper surface of the semiconductor substrate 10 was exposed to form device isolation regions where the inside portions of trenches 12 were filled with silicon oxide 14.

Figure 18D:
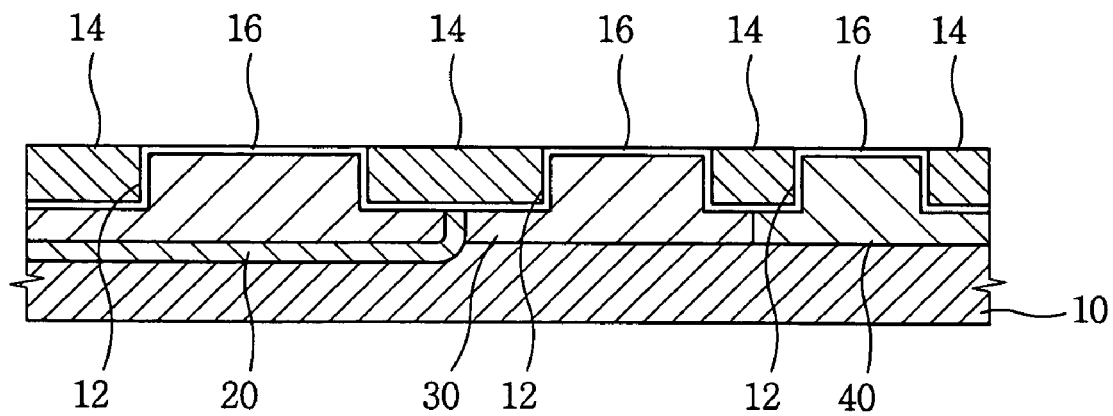

Referring to FIG. 18D, an n-type semiconductor region 20 was formed by doping an n-type impurity, such as phosphorous (P) ions, into a region for forming memory cells of the semiconductor substrate 10 (cell array region). In addition, a p-type well 30 was formed by doping a p-type impurity, such as boron (B) ions, into the cell array region and a portion of the peripheral circuit region. Finally, an n-type well 40 was formed by doping an n-type impurity, such as phosphorous (P) ions, into the remaining region of the peripheral circuit region.

Next, an impurity for controlling a threshold voltage, such as boron fluoride ($BF_2$) was doped into the p-type well 30 and the n-type well 40. Thereafter, each surface portion of the p-type well 30 and the n-type well 40 was cleaned utilizing a fluorine-based cleaning solution. The semiconductor substrate 10 then was wet oxidized to form a gate oxide layer 16 on each surface of the p-type well 30 and the n-type well 40. At this time, portions of the substrate within trenches 12 also were partially oxidized to from a continuous gate oxide layer 16. The thickness of the gate oxide layer 16 was about 40-200 Å (for example, 120 Å).

Figure 18E:
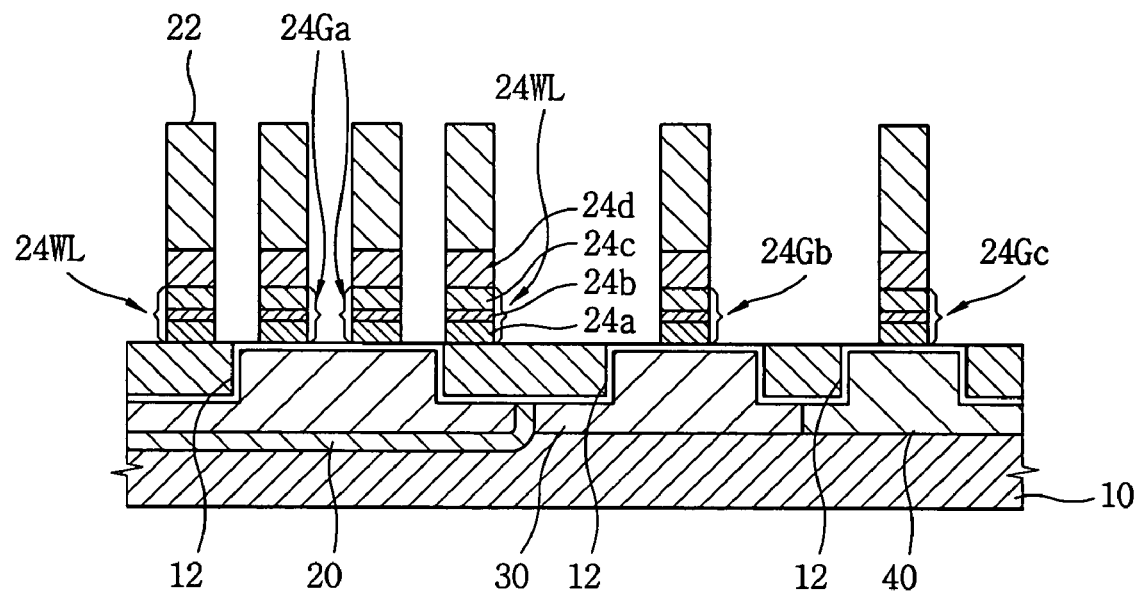
Figure 18F:
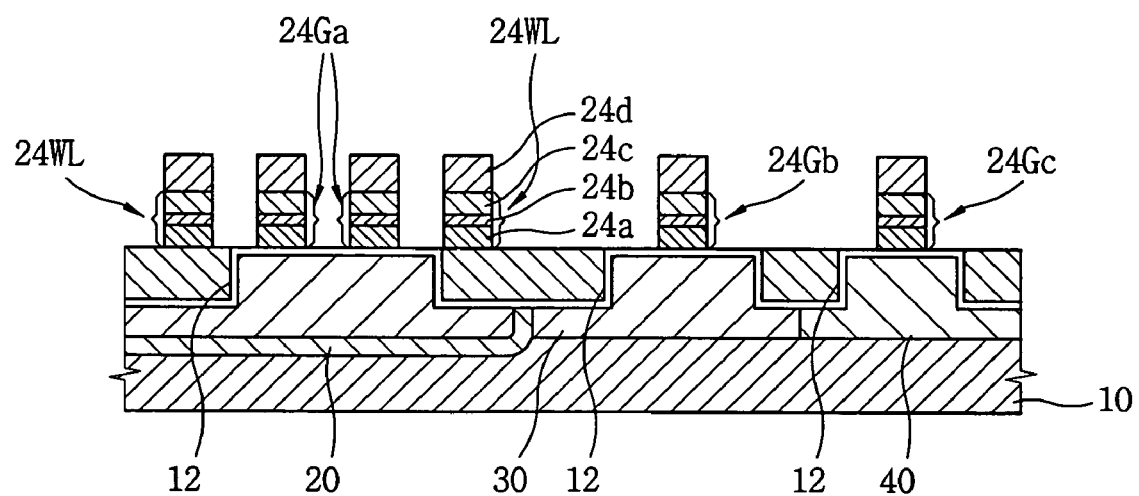

Referring to FIG. 18E, a polysilicon layer was formed on the substrate 10, in which the silicon oxide 14 that filled the trenches 12 as a field oxide, and gate oxide layer 16 were formed. The polysilicon layer had a thickness of about 500 to 4,000 Å (for example, 2300 Å), and was formed by depositing polycrystalline silicon doped with an n-type impurity, such as phosphorous (P) ions, by a low pressure chemical vapor deposition (LPCVD) method. Then, tungsten silicide and tungsten were deposited by a sputtering method on the polysilicon layer to form a tungsten silicide layer and a tungsten layer which had respective thickness of about 1,000 to 2,000 Å. A silicon nitride layer then was deposited on the tungsten layer. The silicon nitride layer was formed to have a thickness of about 500 to 2,000 Å (for example, 1,000 Å) by a LPCVD, or a plasma enhanced chemical vapor deposition (PECVD) method. Skilled artisans are capable of forming the respective layers, using the guidelines provided herein.

A photoresist film then was formed on the silicon nitride layer, and the photoresist film was selectively exposed by utilizing a mask. Then, the photoresist film was developed to form a photoresist pattern 22 for forming gate electrodes. The silicon nitride layer, tungsten layer, tungsten nitride layer, and polysilicon layer then were etched one by one by utilizing the photoresist pattern 22 as an etching mask to form gate electrodes 24Ga, 24Gb, 24Gc and 24GWL composed of a polysilicon pattern 24a, a tungsten silicide pattern 24b, tungsten pattern 24c, and silicon nitride pattern 24d. Gate electrodes 24Ga and word lines 24GWL were formed at the cell array region, and gate electrodes 24Gb and 24Gc were formed at the peripheral circuit region.

The gate electrodes 24Ga and 24GWL formed on the cell array region were manufactured so that the gaps between the gate electrodes were in the range of about 0.4 to 1 μm. The aspect ratio, which is the ratio of the depth with respect to the gap width of gate electrodes 24Ga and 24GWL, was within the range of about 5:1 to 10:1 thereby forming a closely stepped portion. On the other hand, the aspect ratio of the gate electrodes 24Gb and 24Gc formed on the peripheral circuit region, was less than 1:1 thereby forming a global stepped portion.

Referring to FIG. 18, the photoresist pattern 22 was removed. In FIG. 18F, a p-type impurity doped region 25 was formed in the n-type well 40 at both sides of the gate electrode 24Gc by doping a p-type impurity, such as boron ions, into the n-type well 20. Also, an n-type impurity doped region 27 was formed in the p-type well 30 at both sides of the gate electrode 24Gb by doping an n-type impurity, such as phosphorous ions, into the p-type well 30. An n-type impurity doped region 26 was formed in the p-type well 20 at both sides of gate electrodes 24Ga.

Figure 18G:
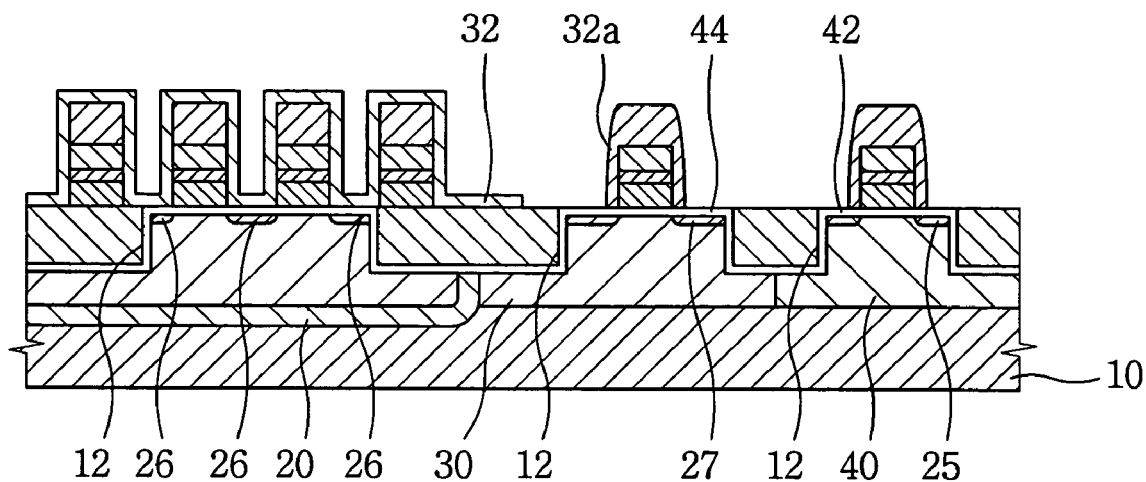

Referring to FIG. 18G, silicon nitride was deposited on the semiconductor substrate 10 by a chemical vapor deposition method to form a silicon nitride layer 32 having a thickness of about 200-600 Å. Next, the silicon nitride layer 32 on the cell array region was covered with a photoresist film, and the silicon nitride layer 32 on the peripheral circuit region was anisotropically etched to form a spacer 32a on side walls of the gate electrodes 24Gb and 24Gc (FIG. 18F) of the peripheral circuit region.

Next, a p+-type impurity doped region (source, drain regions) was formed by doping a p-type impurity, such as boron ions, into the n-type well 40 of the peripheral circuit region. In addition, an n+-type impurity doped region (source, drain regions) was formed by doping an n-type impurity, such as arsenic (As) ions, into the p-type well 30 of the peripheral circuit region.

Figure 18H:
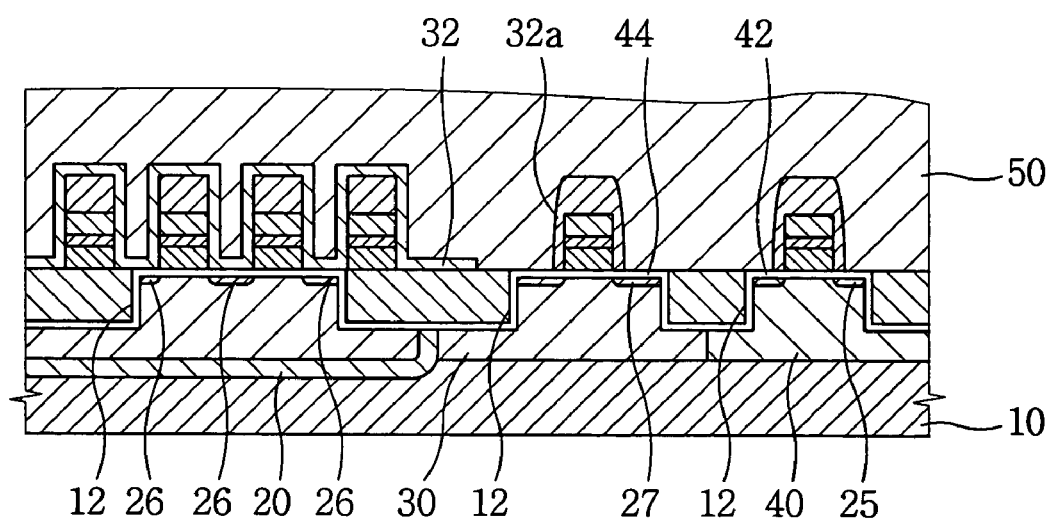

Referring to FIG. 18H, an SOG solution was coated on the semiconductor substrate 10 to form a second SOG layer 50. The second SOG layer 50 was formed by a spin coating method, whereby the rotational velocity of the wafer was about 500-2,500 rpm (for example, 1000 rpm). The weight average molecular weight of perhydropolysilazane contained in the SOG solution was about 3,000-6,000 (for example, 3,000). The thickness of the second SOG layer 50 was in the range of about 7,500 to 8,200 Å (for example, 7,900 Å). The second SOG layer 50 may cover the gate electrodes 24Ga, 24Gb, 24Gc and 24GWL.

Next, the second SOG layer 50 was pre-baked on a hot plate at a temperature within the range of about 100 to 500° C. (for example, 150° C.) in air, and then was main-baked at a temperature within the range of about 600 to 900° C. (for example, 700° C.) for about 10 to 180 minutes (for example, 30 minutes) in a vapor atmosphere. The baking was conducted under at least one atmosphere selected from an oxygen atmosphere, a water vapor atmosphere, an atmosphere containing a mixture of oxygen and water vapor, a nitrogen atmosphere, or mixtures thereof. When the baking was implemented in a water vapor atmosphere, the water content in the atmosphere was controlled to be within the range of about 1.2-86% by weight (for example, 86% by weight).

Figure 18I:
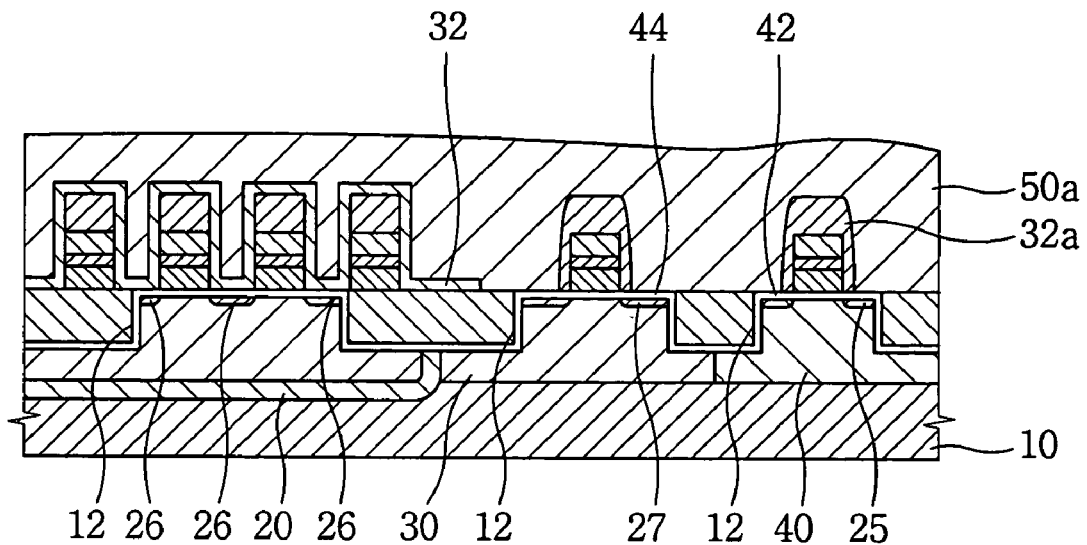

During the curing process, Si—N bonds in the second SOG layer 50 were substituted with Si—O bonds to convert the second SOG layer 50 into a silicon oxide layer 50a. The thickness of second silicon oxide layer 50a decreased by about 19-23% (for example, 22.1%) of the thickness of second SOG layer 50 during this process, as shown in FIG. 18I.

Figure 18J:
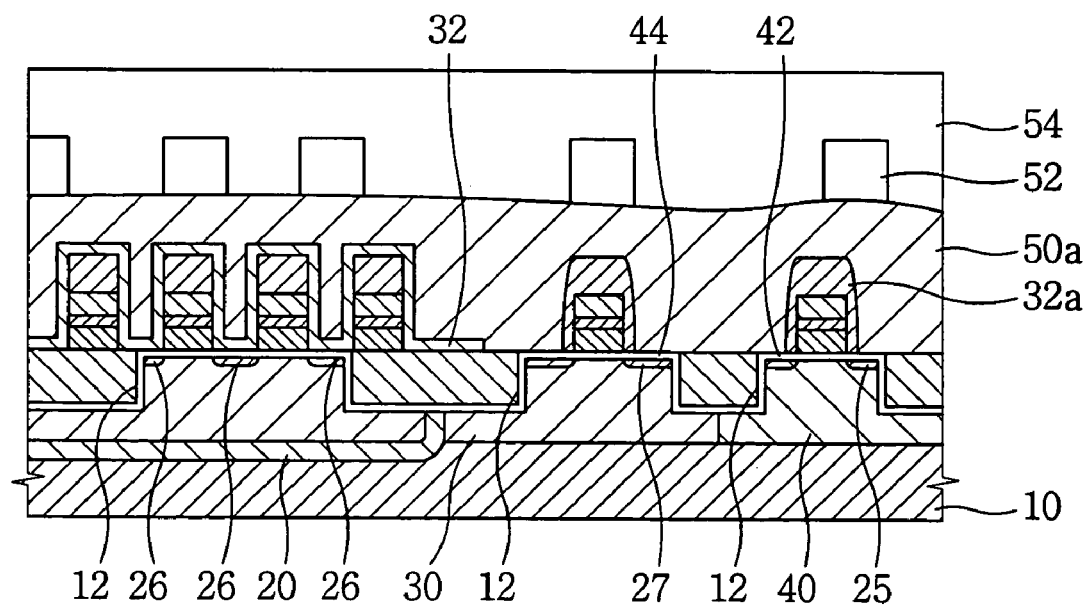

Referring to FIG. 18J, a metal layer with a thickness of about 5,000 Å was formed by depositing a metal such as aluminum, tungsten, etc., on the second silicon oxide layer 50a by utilizing a common sputtering method. Metal patterns 52 having widths of about 6,600 Å, and gaps of about 8,400 Å were formed by patterning the metal layer utilizing a photolithography process. Next, a third SOG layer 54 having a thickness range of about 3,800 to about 4,500 Å (for example, 4,200 Å), and completely covering the metal patterns 52, was formed by spin coating the SOG solution. At this time, the weight average molecular weight of perhydropolysilazane in the third SOG layer 54 is in the range of about 3,000-6,000 (for example, 3000).

Figure 18K:
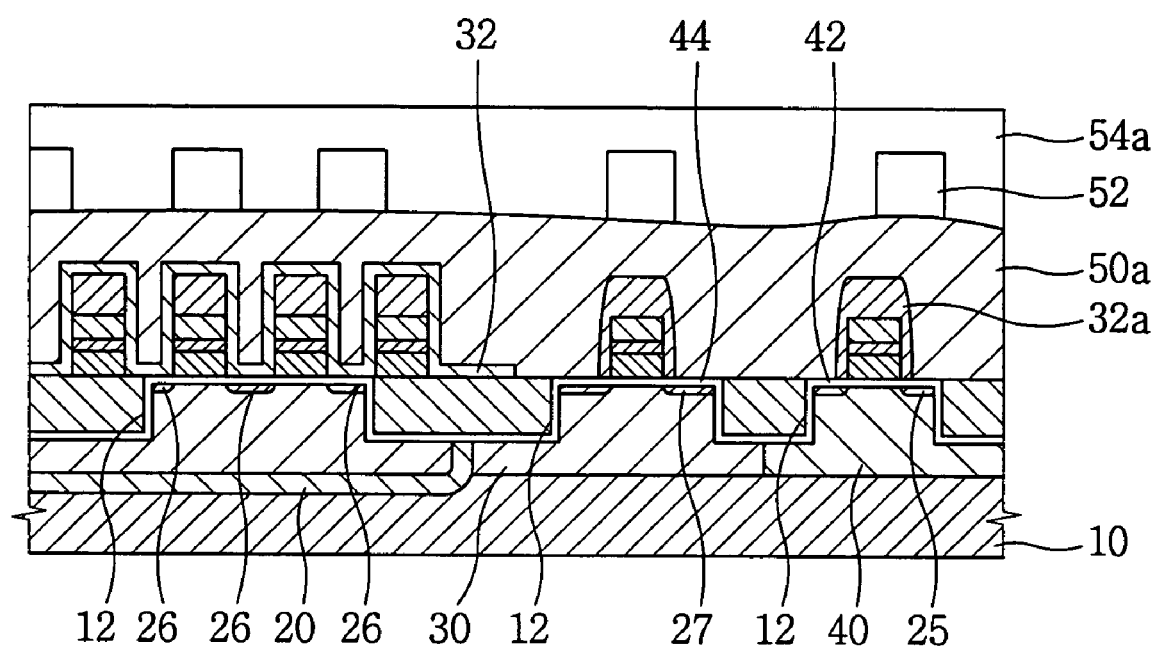

Referring to FIG. 18K, the third SOG layer 54 was pre-baked on a hot plate at a temperature within the range from about 100 to 500° C. (for example, 150° C.) for about 1-5 minutes (for example, 3 minutes) in air, and then main-baked at a temperature within the range of about 400 to 450° C. (for example, 400° C.) for about 10-180 minutes (for example, 30 minutes). The main baking was conducted in a water vapor atmosphere. Then, Si—N bonds in the third SOG layer 54 were substituted with Si—O bonds through the curing process, and in accordance with an aspect of the invention, the third SOG layer 54 was converted into a third silicon oxide layer 54a having a substantially planar surface.

A semiconductor device was manufactured by implementing a conventional semiconductor manufacturing process. Skilled artisans are capable of manufacturing a semiconductor device using the SOG composition and method of the various embodiments of the invention.

EXAMPLES 9-11

Preparation of an SOG Composition

Instead of the prepared SOG composition in Example 4, a different SOG composition is used and silicon oxide layer and semiconductor device are manufactured by 5th embodiment's method. Particularly, the silicon oxide layer and semiconductor device of Examples 9-11 are formed by using the prepared SOG composition in Examples 5-7, respectively.

Comparative Example 2

Preparation of an SOG Composition

Instead of the prepared SOG composition in Example 4, a prepared SOG composition in Comparative Example 1 is used and silicon oxide layer and semiconductor device are manufactured according to the method of Example 8.

Detecting the Formation of a Substrate Oxide

Experiment 6—The Particle Number of an SOG Composition

Figure 19:
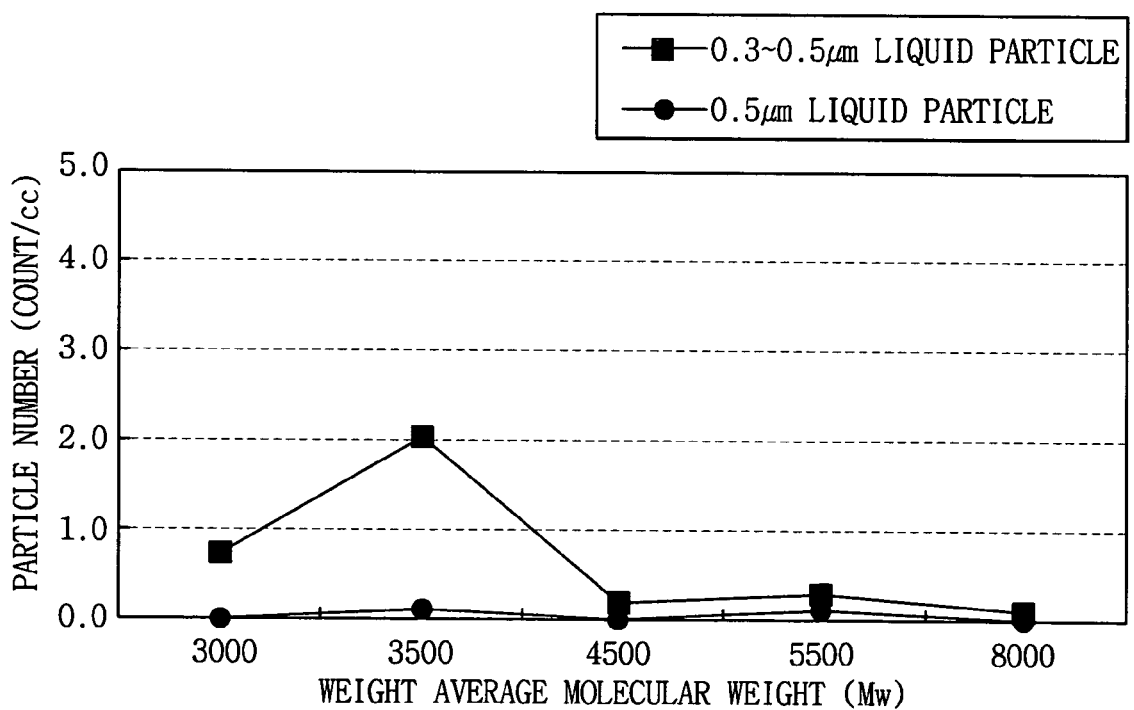
FIG. 19 is a graph illustrating particle number (count/cc) as a function of weight average molecular weight (Mw) according to an embodiment of the present invention.

The SOG composition was manufactured according to Examples 4-7 and Comparative Example 1. The number of particles 0.3-0.5 μm and over 0.5 μm within the SOG composition 1 cc was measured. The results are shown in Table 2 and FIG. 19. FIG. 19 is a graph illustrating particle number (count/cc) as a function of weight average molecular weight (Mw) according to an embodiment of the present invention. The number of particles in this test is observed before SOG composition is cured. There are similar liquid particle levels.

Experiment 7—Absorbance

The absorbance of the second SOG layer 50 and second silicon oxide layer 50a in FIG. 18I of Example 8 was measured by FT-IR. The absorbance was measured after the deposition of SOG composition and pre-baking at about 150° C. for about 3 minutes. The general chemical composition of perhydropolysilazane is (SiH2NH)n. When thermally processed under an atmosphere of oxygen or vapor, the Si—N, Si—H, and N—H bonds in SOG dissociate and all bonds are converted into Si—O bonds.

Figure 20:
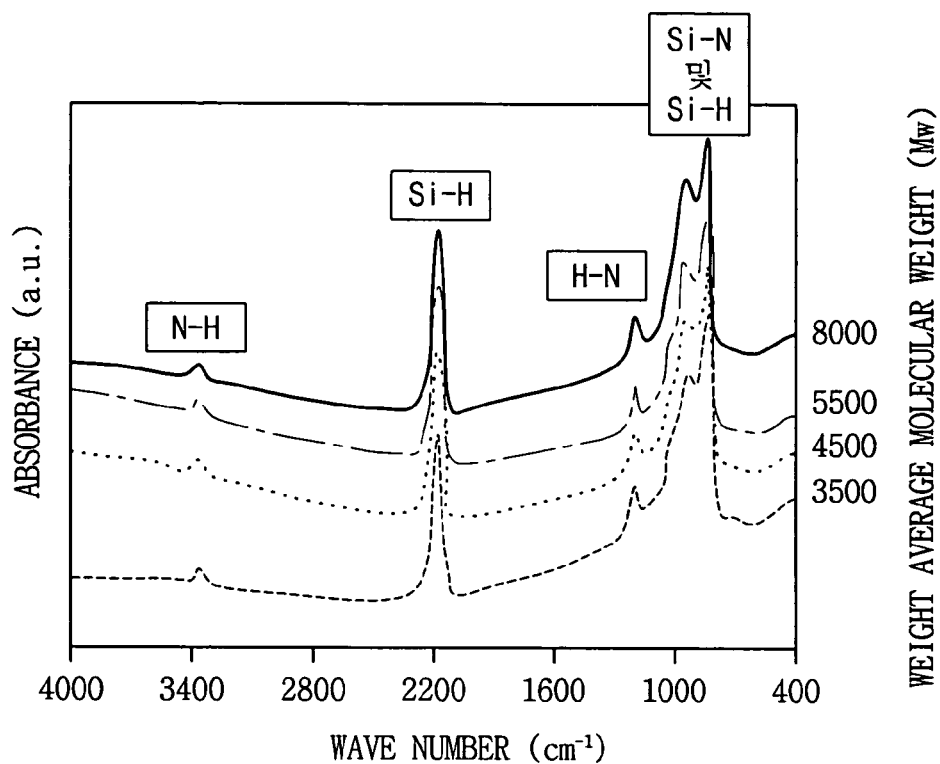
FIG. 20 is a graph illustrating absorbance (a.u.) as a function of wave number ($cm^{-1}$) after pre-baking according to an embodiment of the present invention.
Figure 21:
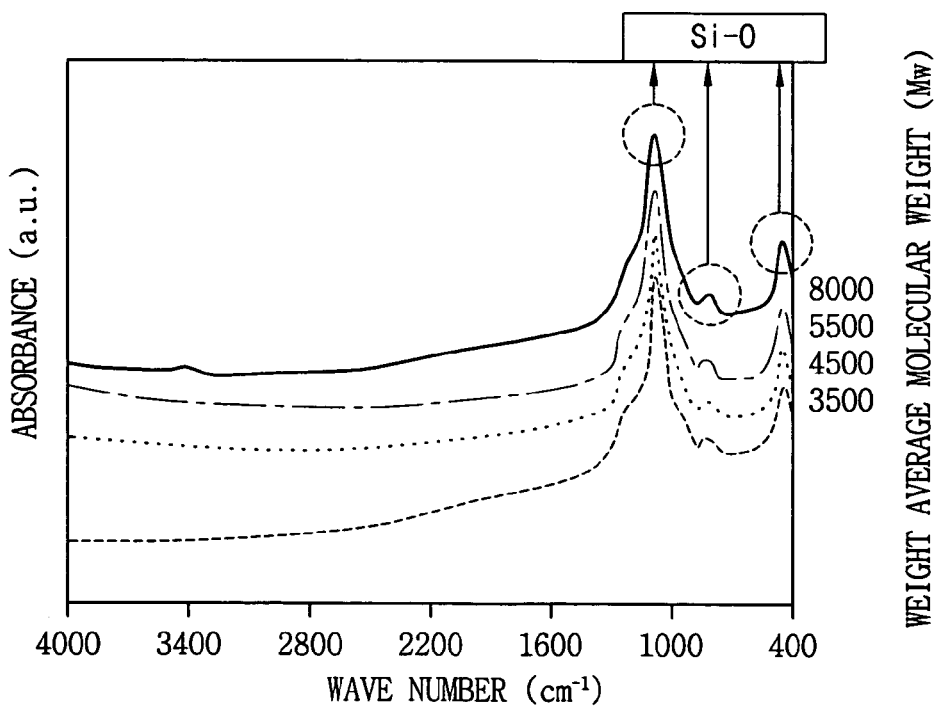
FIG. 21 is a graph illustrating absorbance (a.u.) as a function of wave number ($cm^{-1}$) and weight average molecular weight (Mw) after main baking according to an embodiment of the present invention.

FT-IR (Fourier Transform Infra-red) spectral change as a function of cure temperature and molecular weight is shown in FIG. 20 and FIG. 21. FIG. 20 is a graph illustrating absorbance (a.u.) as a function of wave number ($cm^{-1}$) after pre-baking according to an embodiment of the present invention and FIG. 21 is a graph illustrating absorbance (a.u.) as a function of wave number ($cm^{-1}$) and weight average molecular weight (Mw) after main baking according to an embodiment of the present invention.

SOG film retains substantial N—H, Si—H, and broad Si—N band after the pre-baking step in FIG. 20. Accordingly, FIG. 20 shows the absorbance peaks of N—H, Si—H, and broad Si—N band within 400-4000 $cm^{-1}$.

The main-baking is performed at about 700° C. and about 30 minutes after pre-baking. The intensity of the N—H, Si—H and Si—N absorbance disappeared at the main baking step. It was found that all of the Si—N, Si—H, and N—H bonds in the polysilazane-type SOG film were completely converted into Si—O bonds after the main baking step. Accordingly, FIG. 21 shows the absorbance peaks of in only the Si—O band.

The results shown in FIG. 20 and FIG. 21 relate to Examples 9-11 and Comparative example 2 with the same test method. According to the test results, the improved interdielectric layer characteristic is shown regardless of weight average molecular weight.

Experiment 8—The Thickness of the Silicon Oxide and Shrinkage Ratio

Figure 22:
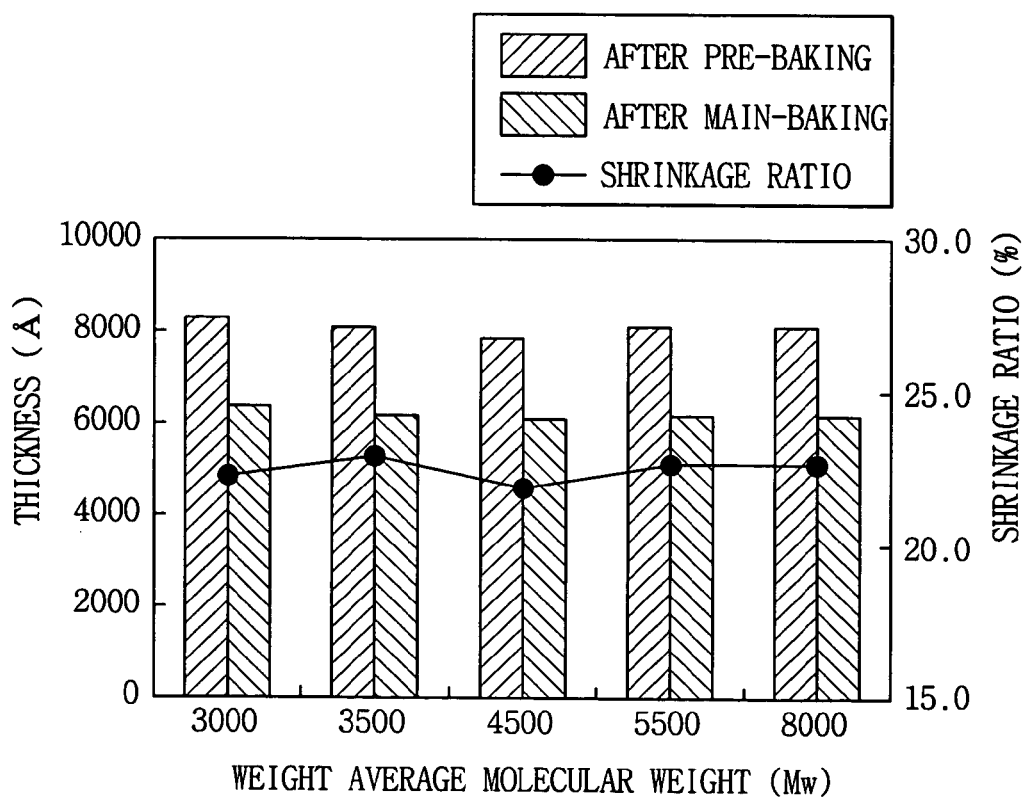
FIG. 22 is a graph illustrating thickness and shrinkage ratio according to weight average molecular weight after pre-baking and after main baking according to an embodiment of the present invention.

Experiment 8 was performed with the same SOG composition and the same silicon oxide film of Experiment 7. The thickness of pre-baking and main-baking was measured and the shrinkage ratio was calculated for the above mentioned SOG composition and silicon oxide. The results are shown in Table 3 and FIG. 22. FIG. 22 is a graph illustrating thickness and shrinkage ratio according to weight average molecular weight after pre-baking and after main baking according to an embodiment of the present invention The shrinkage ratio was calculated in accordance with the following formula 1:

Shrinkage ratio=[SOG thickness after pre-baking–SOG thickness after main-baking]/[SOG thickness after pre-baking]×100

The results are shown in Table 3 and FIG. 22 for Examples 9-11 and Comparative Example 2 employing an identical test method. According to the test results, the SOG thickness and shrinkage ratio of the polysilazane-type SOG have the same values regardless of weight average molecular weight thereof.

Experiment 9—Within Wafer Non-uniformity (WIWNU)

Figure 23:
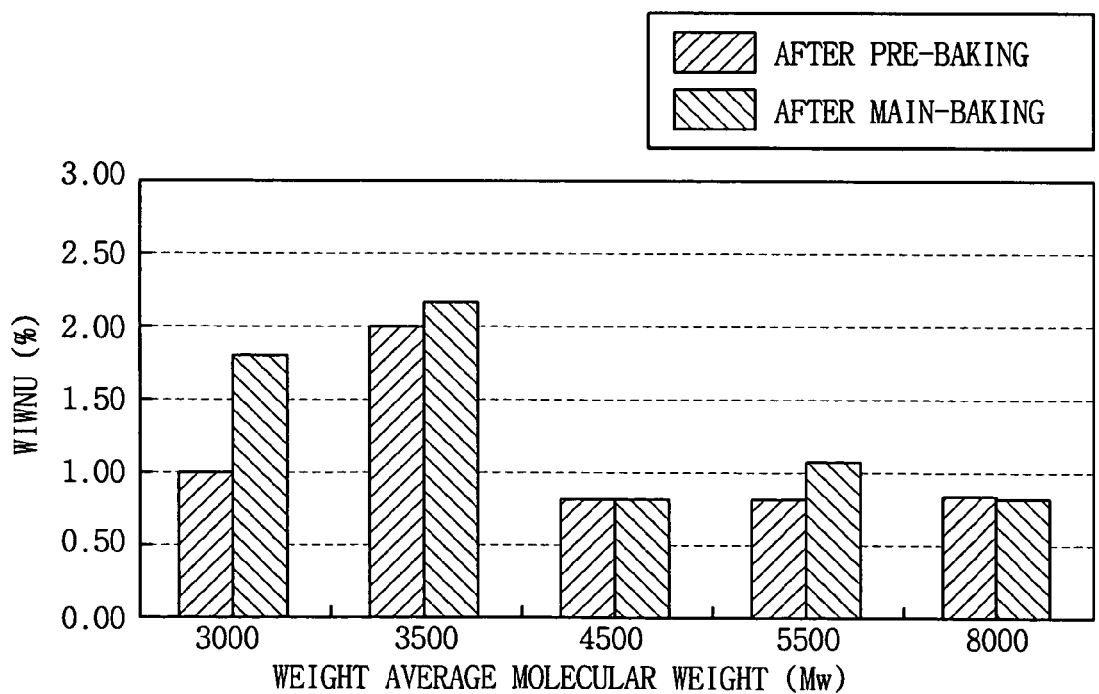
FIG. 23 is a graph illustrating the within wafer non-uniformity (WIWNU) as a function of weight average molecular weight according to an embodiment of the present invention.

Experiment 9 was performed with the same SOG composition and the same silicon oxide as Experiment 8. The WIWNU in wafer was measured and the results are shown in Table 4 and FIG. 23 for Examples 9-11 and Comparative Example 2 employing an identical test method. FIG. 23 is a graph illustrating the WIWNU as a function of weight average molecular weight according to an embodiment of the present invention. According to the test results, the WIWNU has a good value of below 2.5%, regardless of weight average molecular weight.

Experiment 10—The Number of Normalized Particles and Scratches of Silicon Oxide

Figure 24:
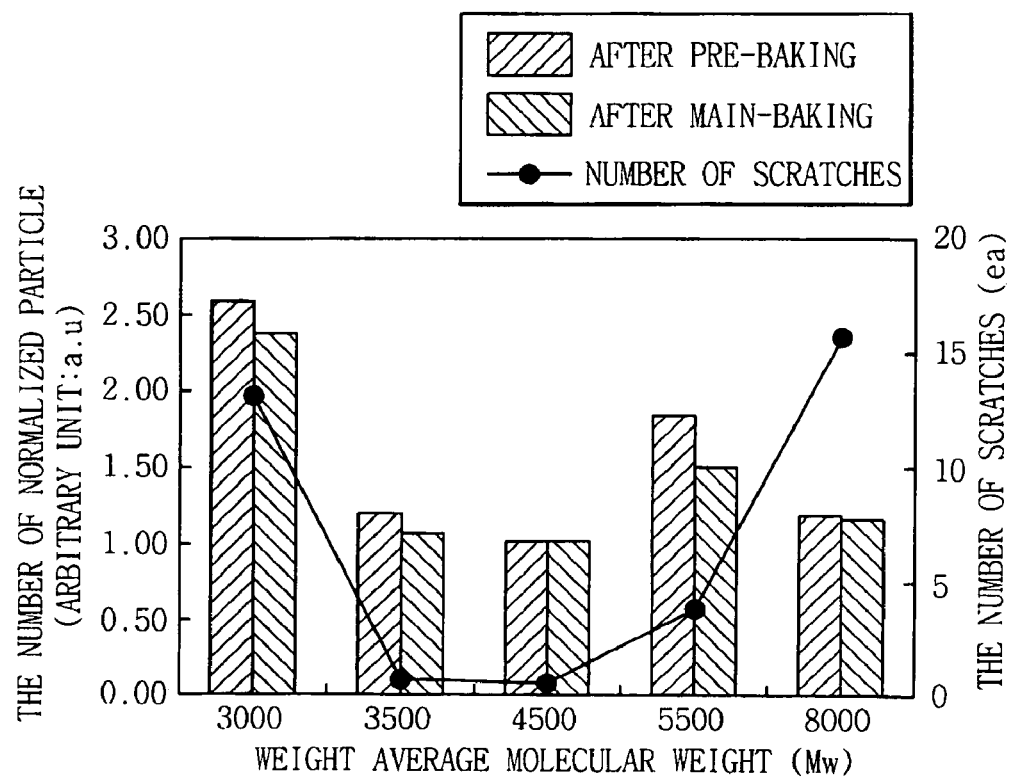
FIG. 24 is a graph illustrating the number of normalized particles and scratches as a function of weight average molecular weight according to an embodiment of the present invention.

Experiment 10 was performed with the same SOG composition and the same silicon oxide as Experiment 8. The number of normalized particles and scratches of silicon oxide was measured and the results are shown in Table 5 and FIG. 24 for Examples 9-11 and Comparative Example 2 employing an identical test method. FIG. 24 is a graph illustrating the number of normalized particles and scratches as a function of weight average molecular weight according to an embodiment of the present invention. The standard of normalization in the number of particles was molecular weight of about 4500.

According to the test results, the number of particles and scratches are fewest when molecular weight is about 3500 or 4500. The occurrence of particles was restrained when the formation of the silicon oxide is performed under the following the conditions of this invention compared to little difference in the number of particles of measured SOG composition according to the weight average molecular weight in Experiment 6.

The number of particles and scratches, shrinkage ratio and WIWNU in the SOG composition of the embodiments and examples is preferable. But the difference of the characteristics as well as the restraint of the particles are improved when the weight average molecular weight is about 3000-6000 in case that the occurrence of the particles and scratches is considered.

As set forth above, even though conventional SOG solutions are baked and cured, there are many particles in the silicon oxide. Particularly, when SOG solution is annealed to be cured after it is deposited on silicon substrate, it is out-gassed such as $SiH_4$. Further, the reaction chamber may be contaminated by $SiO_2$ particles that occur by the reaction of out-gassed $SiH_4$ and oxygen in the atmosphere.

These particles may have sizes over dozens of nm and act as contamination sources when a wafer is annealed in a subsequent process. Resultant semiconductor devices may be degraded due to these contamination sources. The coated polysilazane may be much thicker around these particles. Further, if the thickness of coated polysilazane after annealing is performed over 15,000 Å maximum, cracks may occur.

According to the present invention, a silicon oxide layer free from voids with a planarity required for 256 megabit devices can be formed by utilizing the SOG solution. In addition, a dimension stability can be secured by converting the SOG composition into silicon oxide by a first heat treatment and then densifying the converted silicon oxide for restraining an oxidation of silicon at the active region.

While embodiments of the present invention are described in detail with reference to particularly preferred examples, various modifications, alternate constructions and equivalents may be employed without departing from the true spirit and scope of the present invention.

What is claimed is:

1. A spin-on glass composition comprising:
   polysilazane having the compound formula —(SiH2NH)$_n$— wherein n represents a positive integer, in an amount of about 10 to about 30% by weight, based on the total weight of the composition, whereby the polysilazane has a weight average molecular weight within the range of about 3,300 to about 3,700; and
   a solvent, in an amount of about 70 to about 90% by weight, based on the total weight of the composition,
   wherein a silicon oxide layer formed using the composition has a reduced number of scratches.

2. The spin-on glass composition as claimed in claim 1, wherein the polysilazane is present in an amount of about 20 to about 23% by weight, based on the total weight of the composition, and the solvent is present in an amount of about 77 to about 80% by weight, based on the total weight of the composition.

3. The spin-on glass composition as claimed in claim 1, wherein the polysilazane has a molecular weight dispersion within the range of about 2.5 to about 3.5.

4. The spin-on glass composition as claimed in claim 1, wherein the polysilazane has a molecular weight dispersion within the range of about 2.8 to about 3.2.

5. The spin-on glass composition as claimed in claim 1, wherein the solvent is selected from xylene or dibutyl ether.

6. The spin-on glass composition as claimed in claim 1, wherein the composition has a uniform viscosity within the range of about 1.54 to about 1.70 cP.

7. The spin-on glass composition as claimed in claim 1, wherein the composition has a contact angle of no more than about 4° with respect to an underlying layer on which the composition is coated.

8. The spin-on glass composition as claimed in claim 1, wherein the composition further comprises at least one impurity material selected from the group consisting of boron, fluorine, phosphorous, arsenic, carbon, oxygen, and mixtures thereof.

9. A semiconductor device having at least one planar layer formed without performing a polishing process to attain planarization, the at least one planar layer comprising the composition of claim 1.

10. The semiconductor device as recited in claim 9, wherein the solvent comprises one of xylene and dibutyl ether.

11. The semiconductor device as recited in claim 9, wherein the composition comprises about 20 to about 23% by weight of the polysilazane and about 77 to about 80% by weight of the solvent.

12. The semiconductor device as recited in claim 9, wherein the composition has a uniform viscosity within the range of about 1.54 to about 1.70 cP.

13. The semiconductor device as recited in claim 9, wherein the composition has a contact angle of no more than about 4° with respect to an underlying layer on which the composition is deposited.

14. The semiconductor device as recited in claim 9, wherein the composition includes an impurity selected from the group including consisting of boron, fluorine, phosphorous, arsenic, carbon, oxygen, and a combination thereof.

* * * * *